United States Patent
Setohara

(10) Patent No.: US 9,043,736 B2
(45) Date of Patent: May 26, 2015

(54) CIRCUIT DESIGN SUPPORT METHOD, COMPUTER PRODUCT, AND CIRCUIT DESIGN SUPPORT APPARATUS

(71) Applicant: FUJITSU SEMICONDUCTOR LIMITED, Yokohama-shi, Kanagawa (JP)

(72) Inventor: Yukinori Setohara, Kunitachi (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/231,110

(22) Filed: Mar. 31, 2014

(65) Prior Publication Data

US 2014/0310667 A1    Oct. 16, 2014

(30) Foreign Application Priority Data

Apr. 11, 2013 (JP) .................................. 2013-083329

(51) Int. Cl.
    *G06F 17/50*            (2006.01)

(52) U.S. Cl.
    CPC ........ *G06F 17/5045* (2013.01); *G06F 2217/14* (2013.01)

(58) Field of Classification Search
    USPC ......................................... 716/106, 111, 136
    See application file for complete search history.

(56) References Cited

U.S. PATENT DOCUMENTS

| | | | |
|---|---|---|---|
| 7,099,783 B2 * | 8/2006 | Hasegawa et al. ............... | 702/57 |
| 2002/0129322 A1 | 9/2002 | Hosokawa et al. | |
| 2006/0080576 A1 | 4/2006 | Hirano | |
| 2009/0212818 A1 | 8/2009 | Sakai et al. | |

FOREIGN PATENT DOCUMENTS

| | | |
|---|---|---|
| JP | 2001-312529 | 11/2001 |
| JP | 2006-84427 | 3/2006 |
| JP | 2009-205414 | 9/2009 |

OTHER PUBLICATIONS

Patent Abstracts of Japan, Publication No. 2006-84427, Published Mar. 30, 2006.
Patent Abstracts of Japan, Publication No. 2001-312529, Published Nov. 9, 2001.
Patent Abstracts of Japan, Publication No. 2009-205414, Published Sep. 10, 2009.

\* cited by examiner

*Primary Examiner* — Sun Lin
(74) *Attorney, Agent, or Firm* — Staas & Halsey LLP

(57) ABSTRACT

A circuit-design support method includes obtaining information for a circuit having a logic circuit in which signal lines are connected to input terminals, signals of the signal lines being output via the logic circuit; obtaining information concerning a control circuit that has a first flip-flop for scanning and that can control a value of a given signal line by a value set by the first flip-flop; selecting, based on the circuit information, a second flip-flop at an output destination of a signal from the logic circuit, among second flip-flops of the circuit; and generating, based on the control circuit information, information indicating a serial connection of the control circuit between an output source of the signal of the given signal line and the given signal line and a connection of a data input terminal of the first flip-flop and an output terminal of the selected second flip-flop.

9 Claims, 23 Drawing Sheets

FIG.7

```
TP_con = TP1 (Top/tp1, Null, 1),
TP2 (Top/tp2, Null, 0)
```

FIG.9

```
CP = TP1 (Top/tp1, SFF2, 1)
```

FIG.11

```
CP = TP1 (Top/tp1, SFF2, 1),
TP2 (Top/tp2, SFF5, 0)
```

FIG.15

TP_con = TP3 (Top/tp3, Null, 1)

FIG.16

TP_obs = obs1 (Top/UDL2/tp_obs1) ,
obs2 (Top/SFF1/tp_obs2)

FIG.17

CP = TP3 (Top/tp1, Top/UDL2/tp_obs1, 1)

CIRCUIT DESIGN SUPPORT METHOD, COMPUTER PRODUCT, AND CIRCUIT DESIGN SUPPORT APPARATUS

CROSS REFERENCE TO RELATED APPLICATIONS

This application is based upon and claims the benefit of priority of the prior Japanese Patent Application No. 2013-083329, filed on Apr. 11, 2013, the entire contents of which are incorporated herein by reference.

FIELD

The embodiment discussed herein are related to a circuit design support method, a computer product, and a circuit design support apparatus.

BACKGROUND

A technology called a scan test is conventionally known for testing an integrated semiconductor circuit. For example, in the scan test, a flip-flop is replaced by a scan flip-flop at the time of design of the integrated semiconductor circuit. In the scan test, at the time of a test mode, a shift register is formed by serially connecting the scan flip-flops within the integrated semiconductor circuit and a path is disposed in which the scan flip-flops are controllable or observable from an external input/output terminal.

Conventionally, a technology called a test point insertion (TPI) is known that inserts a mechanism to observe or control the value of a certain signal line in the integrated semiconductor circuit, to improve fault detection accuracy at the time of testing of the integrated semiconductor circuit.

For example, among TPI technologies, a technology is known that improves the fault detection accuracy by connecting a control circuit that includes the scan flip-flop to the signal line whose signal value is difficult to control, making the signal value controllable by the control circuit. For examples of such technologies, refer to Japanese Laid-Open Patent Publication Nos. 2006-84427, 2001-312529, and 2009-205414.

Conventionally, however, a control circuit capable of fixing the value of the signal line to be a specific value cannot cause the value of the signal line to transition from 0 to 1 or from 1 to 0. On the other hand, conventionally, a control circuit capable of causing the value of the signal line to transition from 0 to 1 or from 1 to 0 cannot fix the value of the signal line to be a specific value. For this reason, it is possible that a delay fault cannot be detected by use of either control circuit, resulting in a problem that the fault detection accuracy decreases.

SUMMARY

According to an aspect of an embodiment, a circuit design support method that is executed by a computer, the circuit design method includes obtaining given circuit information that indicates a given circuit that has a logic circuit in which a plurality of signal lines are connected to input terminals, wherein signals of the signal lines are output by way of the logic circuit; obtaining control circuit information concerning a control circuit that has a first flip-flop for scanning and that is capable of controlling a value of a given signal line that among the signal lines, is to be controlled by a value set by the first flip-flop; selecting based on the obtained given circuit information, a second flip-flop among second flip-flops at an output destination of a signal from the logic circuit, among the second flip-flops of the given circuit; and generating based on the obtained control circuit information, connection information that indicates connection of the control circuit in series between an output source of the signal of the given signal line and the given signal line and connection of a data input terminal of the first flip-flop and an output terminal of the selected second flip-flop.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 depicts an example of a control candidate set;

FIG. 9 is an explanatory diagram of a connection information example 1 according to the first example;

FIG. 11 is an explanatory diagram of a connection information example 2 according to the first example;

FIG. 15 is an explanatory diagram of an example of a control candidate set, according to the second example;

FIG. 16 is an explanatory diagram of an example of an observation candidate set;

FIG. 17 is an explanatory diagram of a connection information example according to the second example;

DESCRIPTION OF EMBODIMENTS

An embodiment of a circuit design support method, a computer product, and a circuit design support apparatus according will be described in detail with reference to the accompanying drawings. A control circuit is connected to control a signal line for detection of a delay fault. A delay fault is a fault in which a circuit operates abnormally because the delay time of a signal when passing through one path or the delay time of the signal when passing through one gate is later than desired.

The control circuit is capable of fixing the value of the signal line at a specific value and has a scan flip-flop and a control element corresponding to a destination to which the control circuit is connected. In this control circuit, a data input terminal of the scan flip-flop and an output terminal of the scan flip-flop are connected. In this control circuit, the output terminal of the scan flip-flop and an output source of the signal of the signal line that is to be controlled are connected to the control element. The output terminal of the control element is connected to the signal line that is to be controlled. This control circuit, in which the value held by the scan flip-flop does not change at the next clock cycle, cannot cause the value of the signal line to transition from 0 to 1 or from 1 to 0.

The control circuit, which is capable of causing the value of the signal line to transition from 0 to 1 or from 1 to 0, has the scan flip-flop, the control element corresponding to a destination to which the control circuit is connected, and an inverter. In this control circuit, the input terminal of the inverter is connected to the output terminal of the scan flip-flop and the output terminal of the inverter is connected to the input terminal of the scan flip-flop and the input terminal of the control element. This control circuit, in which the value held by the scan flip-flop is inverted by the inverter at the next clock cycle, cannot fix the value of the signal line to be a specific value.

This embodiment enables one control circuit to fix at a specific value, the value of the signal line to be controlled as well as cause the value to transition from 0 to 1 or from 1 to 0.

Figure 1:
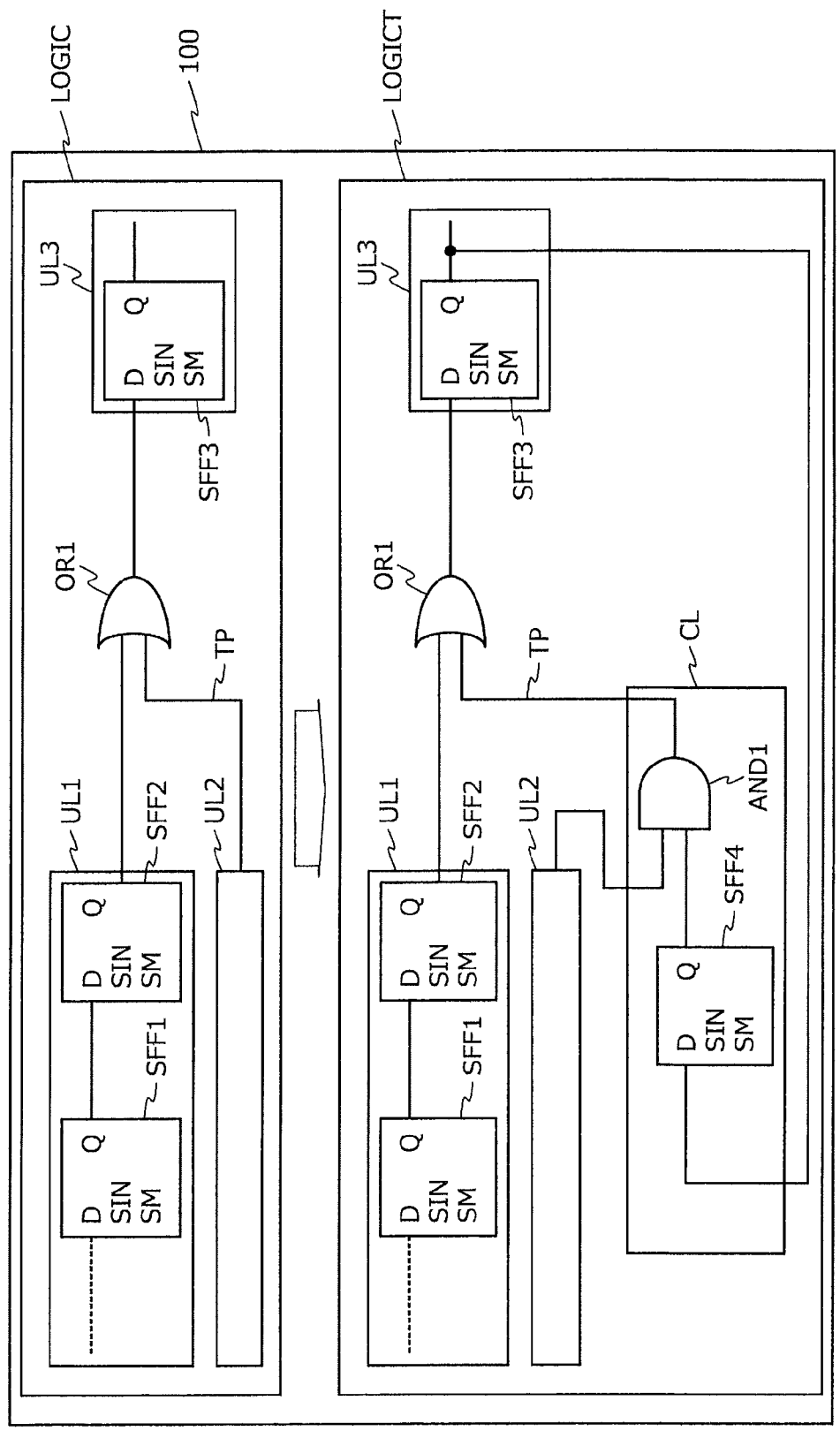
FIG. 1 is an explanatory diagram of a connection example of a control circuit according to an embodiment.

FIG. 1 is an explanatory diagram of a connection example of the control circuit according to the present embodiment. A circuit design support apparatus 100 is a computer that supports the design of given circuit LOGIC. The given circuit LOGIC has plural user logics (ULs) 1 to 3 and an OR circuit OR1 having input terminals connected to plural signal lines. Signals of the plural signal lines are output to a destination outside of the given circuit LOGIC by way of the OR circuit OR1. The signal line that is to be controlled among the plural signal lines connected to the OR circuit OR1 is a signal line TP and a control circuit CL is connected to the signal line TP.

The circuit design support apparatus 100 obtains given circuit information that indicates the given circuit LOGIC. The circuit design support apparatus 100 obtains control circuit information of the control circuit that is the control circuit CL having a first flip-flop for scanning and that can control the value of the signal line to be controlled by the value set in the first flip-flop. The control circuit information is, for example, the information concerning the type of the control circuit to be connected to the signal line to be controlled.

The circuit design support apparatus 100, based on the given circuit information, selects any one second flip-flop among second flip-flops at the output destination of the signal of the OR circuit OR1. The second flip-flops at the output destination are the flip-flops subsequent to the OR circuit OR1. In the example of FIG. 1, the flip-flops are SFF1 to SFF3 and the second flip-flop is the SFF3.

The circuit design support apparatus 100 generates connection information that indicates connecting of the data input terminal of the first flip-flop SFF4 for scanning and the output terminal of the selected second flip-flop SFF3. The control circuit CL has the first flip-flop SFF4 and a two-input AND circuit AND1. Details of the control circuit CL will be depicted in FIGS. 2 and 3. The connection information indicates connecting of the input terminal of the AND circuit AND1 within the control circuit CL and a logic circuit UL2 as an output source of the signal of the signal line TP to be controlled. To be more specific, the connection information indicates connecting of the input terminal of the AND circuit AND1 within the control circuit CL and the output terminal of the logic circuit UL2. The connection information indicates connecting of the signal line TP and the output terminal of the control circuit CL. This makes it possible to connect the control circuit CL capable of controlling the signal line TP that is to be controlled.

For example, with 0 set in the flip-flop SFF3 and the flip-flop SFF4, within plural clock cycles, the value of the signal line TP becomes 0 as a non-controlled value of the OR circuit OR1. Consequently, the signal from the user logic UL1 is propagated by way of the OR circuit OR1. This makes is possible to detect a transition fault of the signal line from the output terminal of the user logic UL1.

For example, with different values set in the flip-flop SFF3 and the flip-flop SFF4, the signal transitioning from 0 to 1 or from 1 to 0 is propagated to the signal line TP within two clock cycles. With the value of the signal from the user logic UL1 set to 0, within this period of two clock cycles, the signal of the signal line TP transitioning from 0 to 1 or from 1 to 0 is propagated by way of the OR circuit OR1. This makes it possible to detect a transition fault of the signal line TP that is to be controlled.

Since the flip-flop preceding the OR circuit OR1 may have determined the value of the signal desired to be propagated, a test pattern is difficult to design. On the other hand, since the flip-flop subsequent to the OR circuit OR1 has a low possibility of determining the value of the signal desired to be propagated, the test pattern is easy to design. Therefore, the circuit design support apparatus 100 enables control of the object that is to be subject to control, by a flip-flop in which the value is easy to control and enables improved fault detection accuracy.

The circuit design support apparatus 100 may generate circuit information that indicates a given circuit LOGICT to which the control circuit CL connected, according to the connection information.

Figure 2A:
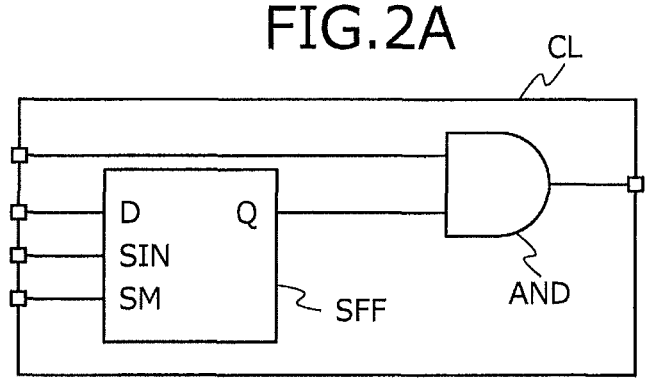
FIGS. 2A and 2B are explanatory diagrams of examples of the control circuit, which can be fixed at 0.
Figure 2B:
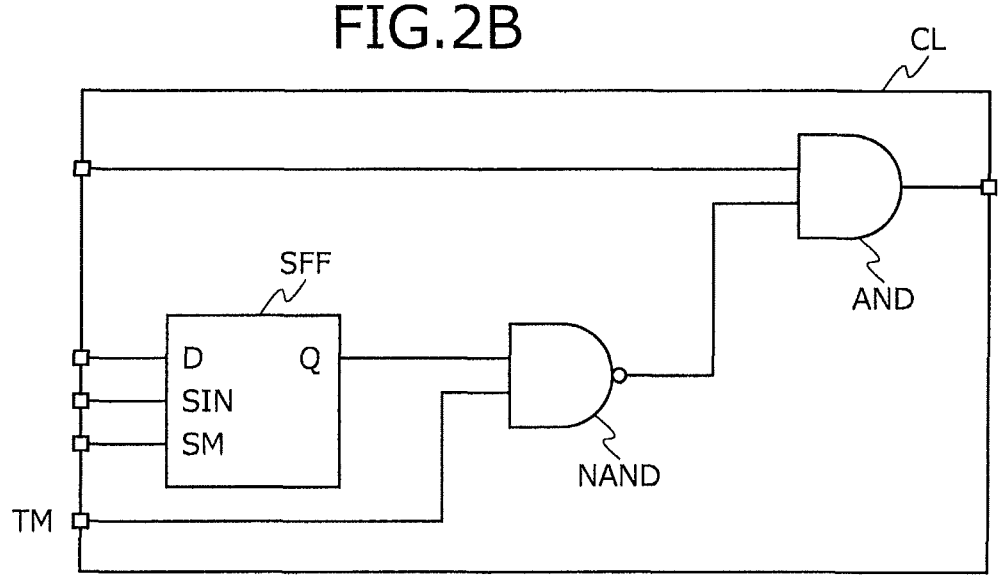

FIGS. 2A and 2B are explanatory diagrams of examples of the control circuit, which can be fixed at 0. When, for example, the signal line to be controlled is likely to become 1, in other words, when the probability of the signal value becoming 1 is higher than the probability of the signal value becoming 0, the control circuit CL capable of fixing the output value at 0 as depicted in FIGS. 2A and 2B is used where, for example, the signal line to be controlled is connected to the input terminal of a logic circuit whose non-controlled value is 0 such as an OR circuit or a NOR circuit.

The control circuit CL depicted in FIG. 2A is the same as the control circuit CL depicted in FIG. 1 and has the scan flip-flop SFF and the two-input AND circuit AND. Since the flip-flops to be described hereinafter are flip-flops for scanning, description of the scanning purpose will be omitted. One input terminal of the AND circuit AND is connected to the output terminal of the flip-flop SFF and the other input terminal of the AND circuit AND is connected to the output source of the signal of the signal line to be controlled. The output terminal of the AND circuit AND is connected to the signal line to be controlled.

The control circuit CL depicted in FIG. 2B has the flip-flop SFF, a two-input NAND circuit NAND, and the two-input AND circuit AND. One input terminal of the two-input NAND circuit NAND is connected to the output terminal of the flip-flop SFF and the other terminal of the NAND circuit NAND receives an input of a test mode signal TM to switch the test mode. One input terminal of the AND circuit AND is connected to the output terminal of the NAND circuit NAND and the other input terminal of the AND circuit AND is connected to the output source of the signal of the signal line to be controlled. The output terminal of the AND circuit AND is connected to the signal line to be controlled. If the test mode signal TM is 0, it indicates a normal operation mode and if the test mode signal TM is 1, it indicates the test mode.

The output terminal of the flip-flop that is downstream of the signal line to be controlled is connected to the data input terminal of the flip-flop SFF within the control circuit CL. As a result, with the values of the flip-flop SFF and the subsequent flip-flop set to 0 within plural clock cycles, the signal value of the signal line to be controlled is fixed at 0 within plural clock cycles. If the value of the signal from the user logic UL1 transitions from 0 to 1 or from 1 to 0 within this period of plural clock cycles, it is made possible to detect a transition fault of the signal line connected to the output terminal of the user logic UL1. The transition fault is a fault in which the transition of the signal of one signal line from the logic circuit is delayed for some reason.

With different values set in the flip-flop SFF and the subsequent flip-flop, a signal transitioning from 0 to 1 or from 1 to 0 is propagated within two clock cycles to the signal line to be controlled.

Figure 3A:
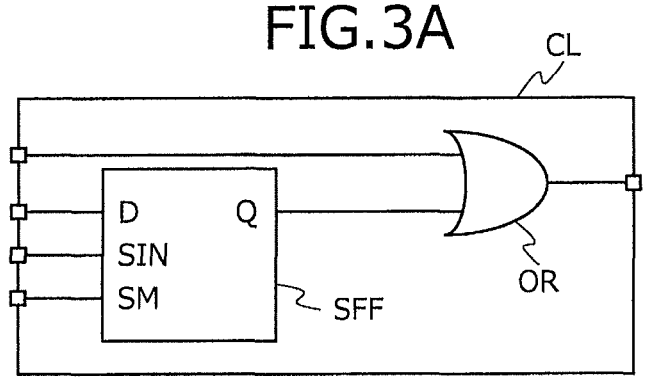
FIGS. 3A and 3B are explanatory diagrams of examples of the control circuit, which can be fixed at 1.
Figure 3B:
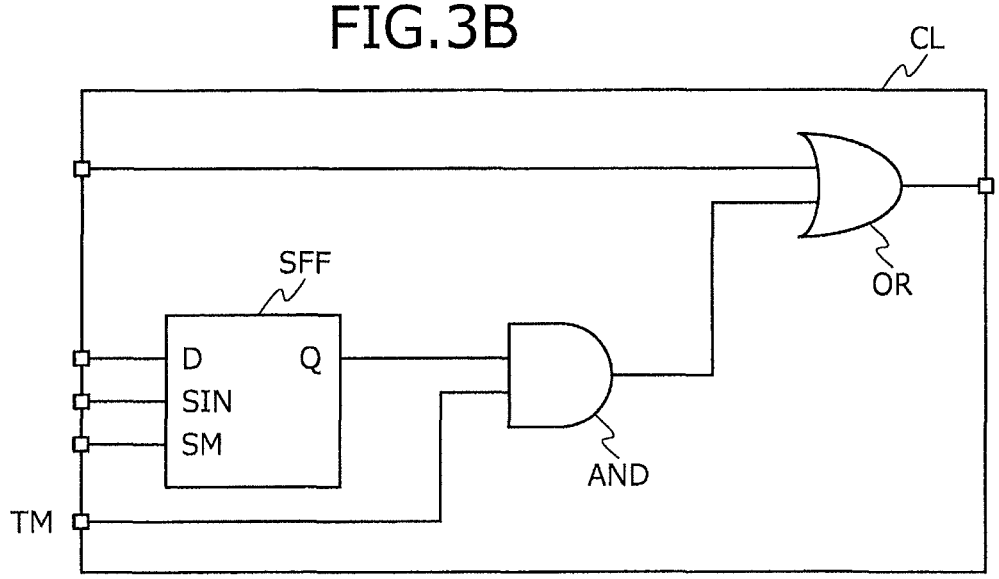

FIGS. 3A and 3B are explanatory diagrams of examples of the control circuit, which can be fixed at 1. When, for example, the signal line to be controlled is likely to become 0, in other words, when the probability of the signal value becoming 0 is higher than the probability of the signal value becoming 1, the control circuit CL capable of fixing the output value at 1 as depicted in FIGS. 3A and 3B is used where, for example, the signal line to be controlled is connected to the input terminal of a logic circuit whose non-controlled value is 1 such as an AND circuit or a NAND circuit.

The control circuit CL depicted in FIG. 3A has the scan flip-flop SFF and the two-input OR circuit OR. One input terminal of the OR circuit OR is connected to the output terminal of the flip-flop SFF and the other input terminal of the OR circuit OR is connected to the output source of the signal of the signal line to be controlled. The output terminal of the OR circuit OR is connected to the signal line to be controlled.

The control circuit CL depicted in FIG. 3B has the flip-flop SFF, a two-input OR circuit OR, and the two-input AND circuit AND. One input terminal of the two-input AND circuit AND is connected to the output terminal of the flip-flop SFF and the other terminal of the AND circuit AND receives an input of a test mode signal TM to switch the test mode. One input terminal of the OR circuit OR is connected to the output terminal of the AND circuit AND and the other input terminal of the OR circuit OR is connected to the output source of the signal of the signal line to be controlled. The output terminal of the OR circuit OR is connected to the signal line to be controlled.

The output terminal of the flip-flop that is downstream of the signal line to be controlled is connected to the data input terminal of the flip-flop SFF within the control circuit CL. As a result, with the values of the flip-flop SFF and the subsequent flip-flop set to 1 within plural clock cycles, the signal value of the signal line to be controlled is fixed at 1 within plural clock cycles.

With different values set in the flip-flop SFF and the subsequent flip-flop, a signal transitioning from 0 to 1 or from 1 to 0 is propagated within two clock cycles to the signal line to be controlled.

Figure 4:
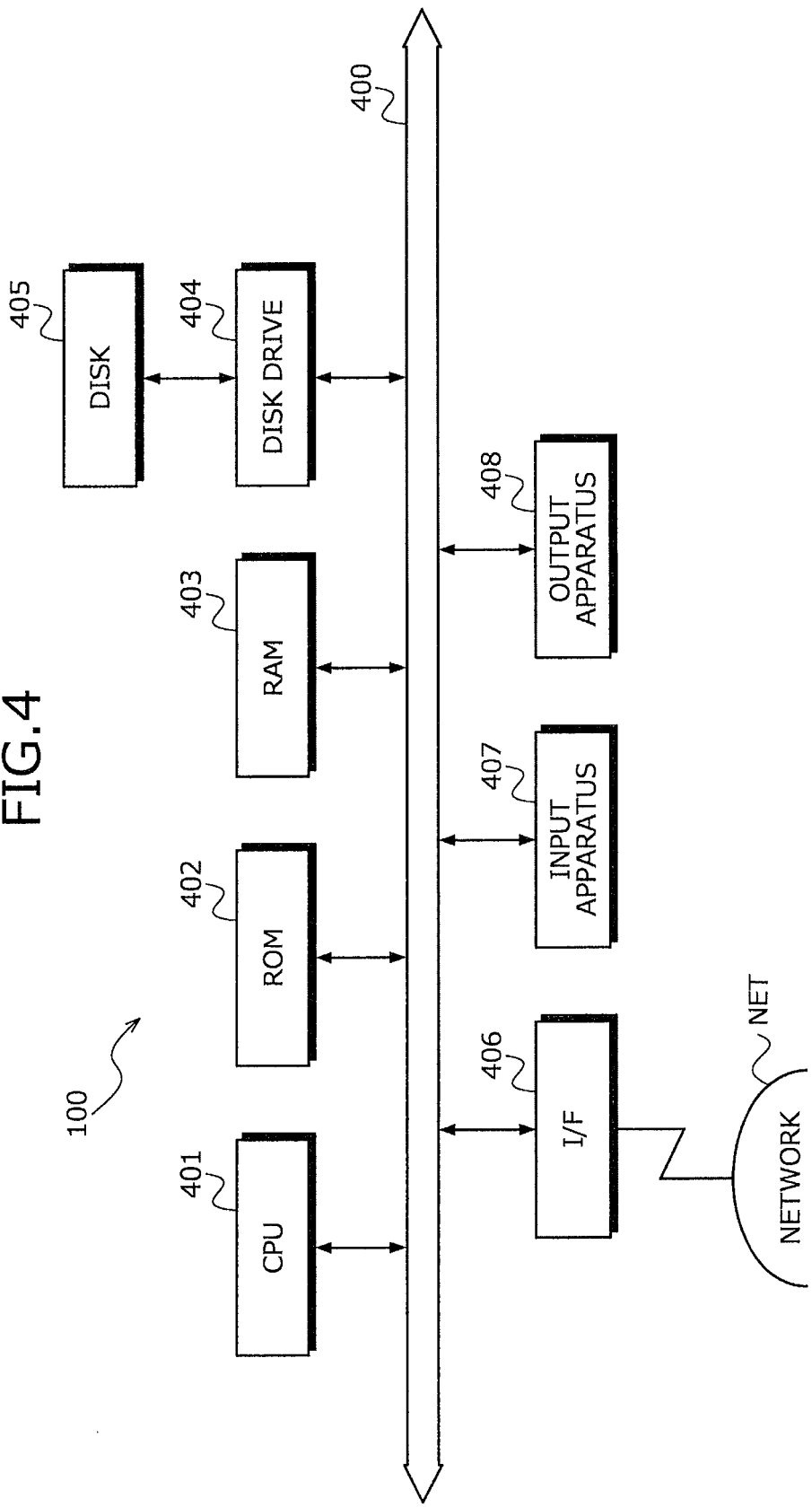
FIG. 4 is a block diagram of a hardware configuration example of a circuit design support apparatus.

FIG. 4 is a block diagram of a hardware configuration example of the circuit design support apparatus. The circuit design support apparatus 100 has a central processing unit (CPU) 401, read-only memory (ROM) 402, random access memory (RAM) 403, a disk drive 404, and a disk 405. The circuit design support apparatus 100 further has an interface (I/F) 406, an input apparatus 407, and an output apparatus 408. Each of the components is connected by a bus 400.

The CPU 401 governs overall control of the circuit design support apparatus 100. The ROM 402 is a storage unit that stores various types of programs such as a boot program. The RAM 403 is a storage unit that is used as a work area of the CPU 401. The disk drive 404, under the control of the CPU 401, controls the reading and writing of data with respect to the disk 405. The disk 405 stores data written thereto under the control of the disk drive 404. A magnetic disk, an optical disk, and the like may be used as the disk 405.

The I/F 406 is connected, via a communication line, to a network NET such as a local area network (LAN), a wide area network (WAN) and the Internet, and is connected to other apparatuses through the network NET. The I/F 406 administers an internal interface with the network NET and controls the input and output of data with respect to external apparatuses. A modem, a LAN adapter, and the like may be used as the I/F 406.

The input apparatus 407 is an interface that inputs various types of data via user manipulation of a keyboard, mouse, touch panel, and the like. The input apparatus 407 can take in images and moving pictures from a camera as well as audio from a microphone. The output apparatus 408 is an interface that outputs data consequent to an instruction from the CPU 401. A display and/or a printer may be used as the output apparatus 408.

Figure 5:
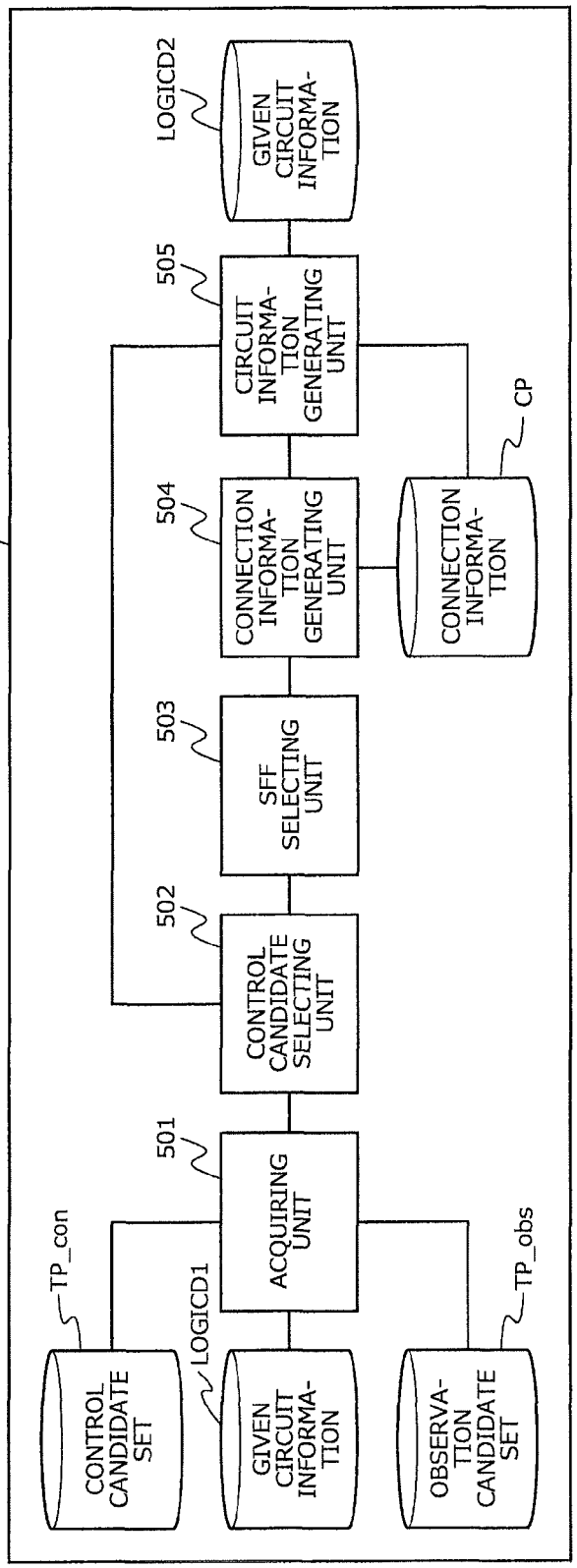
FIG. 5 is a block diagram of a functional configuration example of the circuit design support apparatus.

FIG. 5 is a block diagram of a functional configuration example of the circuit design support apparatus. The circuit design support apparatus 100 has an acquiring unit 501, a control candidate selecting unit 502, an SFF selecting unit 503, a connection information generating unit 504, and a circuit information generating unit 505. Processing of the acquiring unit 501 to the circuit information generating unit 505 is coded in a circuit design support program stored in a storage device such as, for example, the disk 405 that can be accessed by the CPU 401. The CPU 401 reads out the circuit design support program stored in the storage device and executes the processing coded in the circuit design support program, thereby implementing the processing of the acquiring unit 501 to the circuit information generating unit 505. Results of the processing are stored in a storage device such as, for example, the RAM 403 and the disk 405.

The embodiment will be described, divided into a first example and a second example. In the first example, the output of the flip-flop at the subsequent step of the signal line to be controlled is connected to the data input terminal of the flip-flop within the control circuit CL to be connected to the signal line to be controlled. In the second example, the output of the flip-flop having the least number of logic steps from the signal line to be controlled, among the subsequent flip-flops and the flip-flops for observing, is connected to the data input terminal of the flip-flop within the control circuit CL to be connected to the signal line to be controlled.

In the first example, the output of the flip-flop subsequent to the signal line to be controlled is connected to the data input terminal of the flip-flop within the control circuit CL to be connected to the signal line to be controlled. This makes it possible to control the value of the signal line to be controlled by the value of the flip-flop that has little effect on other circuits and other signal lines and also enables improved delay fault detection accuracy.

The acquiring unit 501 obtains the given circuit information LOGICD1 indicative of a cell-to-cell connection relationship within the given circuit LOGIC. The given circuit information LOGICD1 as used herein is a netlist. The given circuit information LOGICD1 is described in a hardware description language or system description language such as, for example, Verilog and very high speed integrated circuit hardware description language (VHDL). The acquiring unit 501 may obtain the given circuit information LOGICD1 input by way of the input device 407. The acquiring unit 501 may obtain the given circuit information LOGICD1 stored in a storage device such as the RAM 403 and the disk 405. The acquiring unit 501 may obtain the given circuit information LOGICD1 from another device by way of the network NET.

Figure 6:
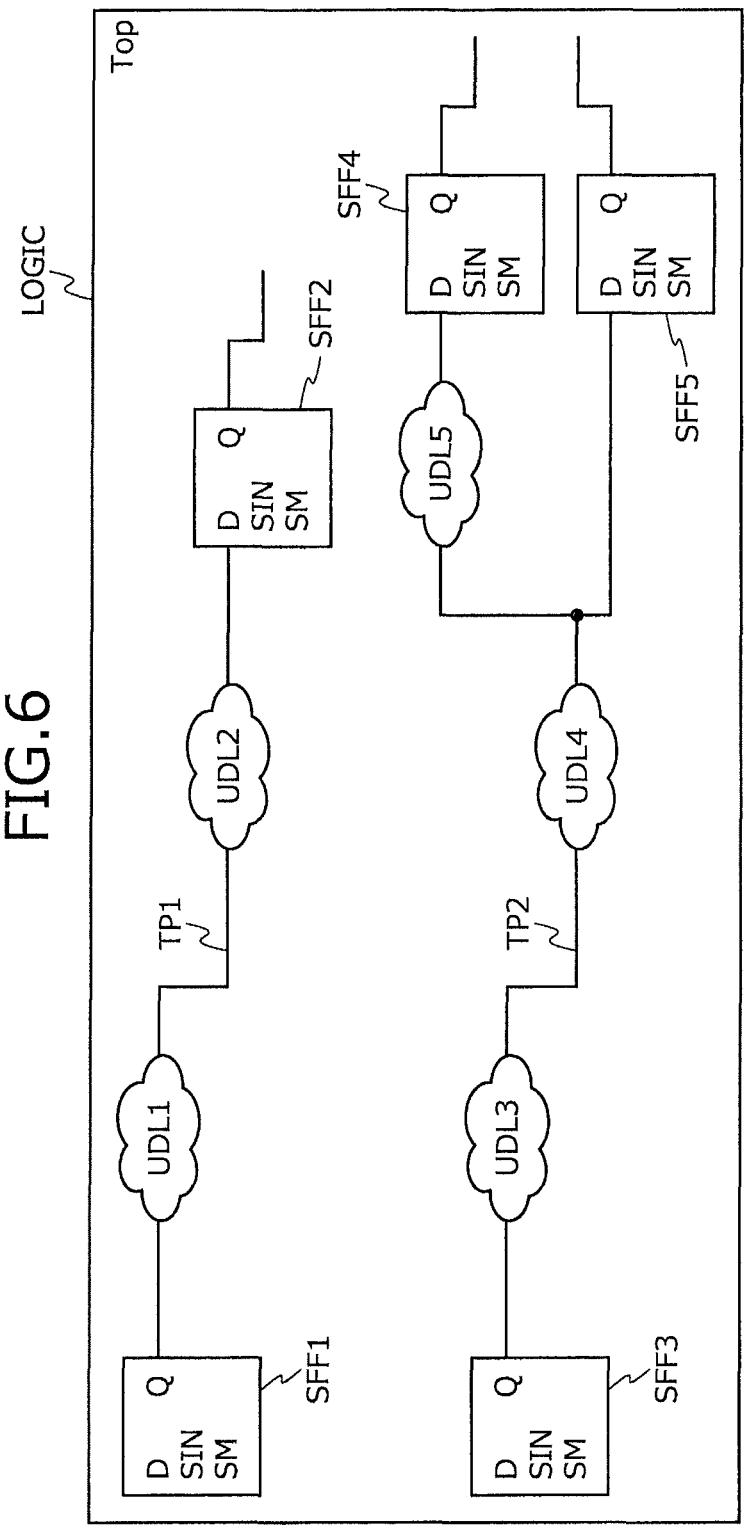
FIG. 6 is an explanatory diagram of an example of a given circuit under design, according to a first example.

FIG. 6 is an explanatory diagram of an example of a given circuit under design, according to the first example. The given circuit LOGIC has plural flip-flops SFF1 to SFF5 for scanning and plural user-defined logics (UDLs) UDL1 to UDL5. The signal lines to be controlled in terms of the signal value are TP1 and TP2. The signal line to be controlled is hereinafter referred to as a control candidate. The signal of the control candidate TP1 is output to an external destination of the given circuit LOGIC by way of the user-defined logic UDL2. The signal of the control candidate TP2 is output to an external destination of the given circuit LOGIC by way of the user-defined logic UDL4.

The acquiring unit 501 obtains a control candidate set TP_con having elements indicative of plural control candidates within the given circuit LOGIC. The acquiring unit 501 may obtain the control candidate set TP_con input by way of the input device 407. The acquiring unit 501 may obtain the control candidate set TP_con stored in the storage device such as the RAM 403 and the disk 405. The acquiring unit 501 may obtain the control candidate set TP_con from another device by way of the network NET. Each element has identification information of the control candidate, identification information of the flip-flop to be connected to the data input terminal, and control circuit information regarding the control circuit CL to be connected to the control candidate. The identification information of the control candidate to be controlled is, for example, a control candidate name Name1. The identification information of the flip-flop to be connected to the data input terminal is, for example, an SFF name Name2. For example, when the control candidate set TP_con is obtained, null has been set at the SFF name Name2. The control circuit information indicates the type of the control circuit CL. The control candidate name Name1 is, for example, a net name, etc., including the absolute path from a module indicative of the given circuit LOGIC as a whole to a module having the control candidate, included in the given circuit information LOGICD1. The control circuit information is, for example, the type of the control circuit CL to be connected to the control candidate. The type of the control circuit CL to be connected to the control candidate is determined based on the non-controlled value of the logic circuit to which the control candidate is connected. If the non-controlled value is 0, the type is set to 0 and if the non-controlled value is 1, the type is set to 1.

Figure 7:
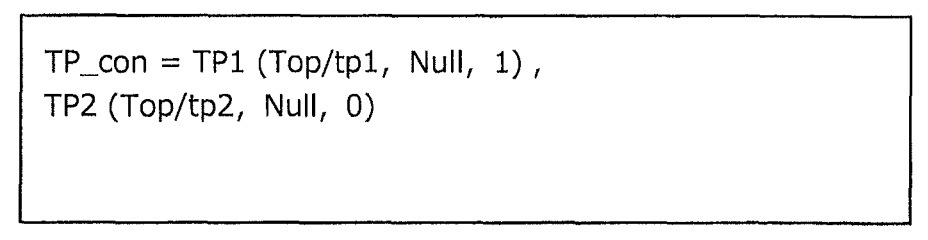

FIG. 7 depicts an example of a control candidate set. The control candidate name Name1, the SFF name Name2, and the type are denoted in that order in parentheses immediately following the TPn (n=1 to 2 in FIG. 7) as each element of the control candidate set TP_con.

The control candidate selecting unit 502 selects any one element tp among the control candidate set TP_con. The control candidate indicated by the element tp is referred to as a control candidate tpt. In this example, the control candidate selecting unit 502 selects the element indicative of the control candidate TP1 as the element tp.

The SFF selecting unit 503 selects any one flip-flop among the flip-flops at the output destination of the logic circuit having the input terminal to which the control candidate tpt is connected. The SFF selecting unit 503 select any one flip-flop among the flip-flops whose number of logic steps from the control candidate tpt is within a predetermined number of steps Trace_limit, among the flip-flops at the output destination. The predetermined number of steps Trace_limit is determined by a designer of the given circuit LOGIC or a user of the circuit design support apparatus 100. The predetermined number of steps Trace_limit is stored in a storage device such as, for example, the disk 405. Layout design is not yet performed at the time of inserting the control circuit CL, but if the first flip-flop for scanning of the control circuit to be connected to the signal line to be controlled and the second flip-flop having a large number of logic steps are connected, then it is possible that these two flip-flops are arranged distantly or that the layout cannot be performed. For this reason, with the selection of the flip-flop whose number of logic steps from the control candidate is within the predetermined number of steps Trace_limit, a flip-flop arranged closer to the control candidate tpt is connected and the layout can be made easier.

The SFF selecting unit 503 selects the flip-flop having the least number of logic steps from the control candidate tpt among the flip-flops at the output destination. For example, the SFF selecting unit 503 searches for the flip-flops at the output destination in ascending order of the number of logic steps from the control candidate tpt. As a result, a flip-flop arranged closer to the control candidate tpt is connected and the layout can be made easier.

Figure 8:
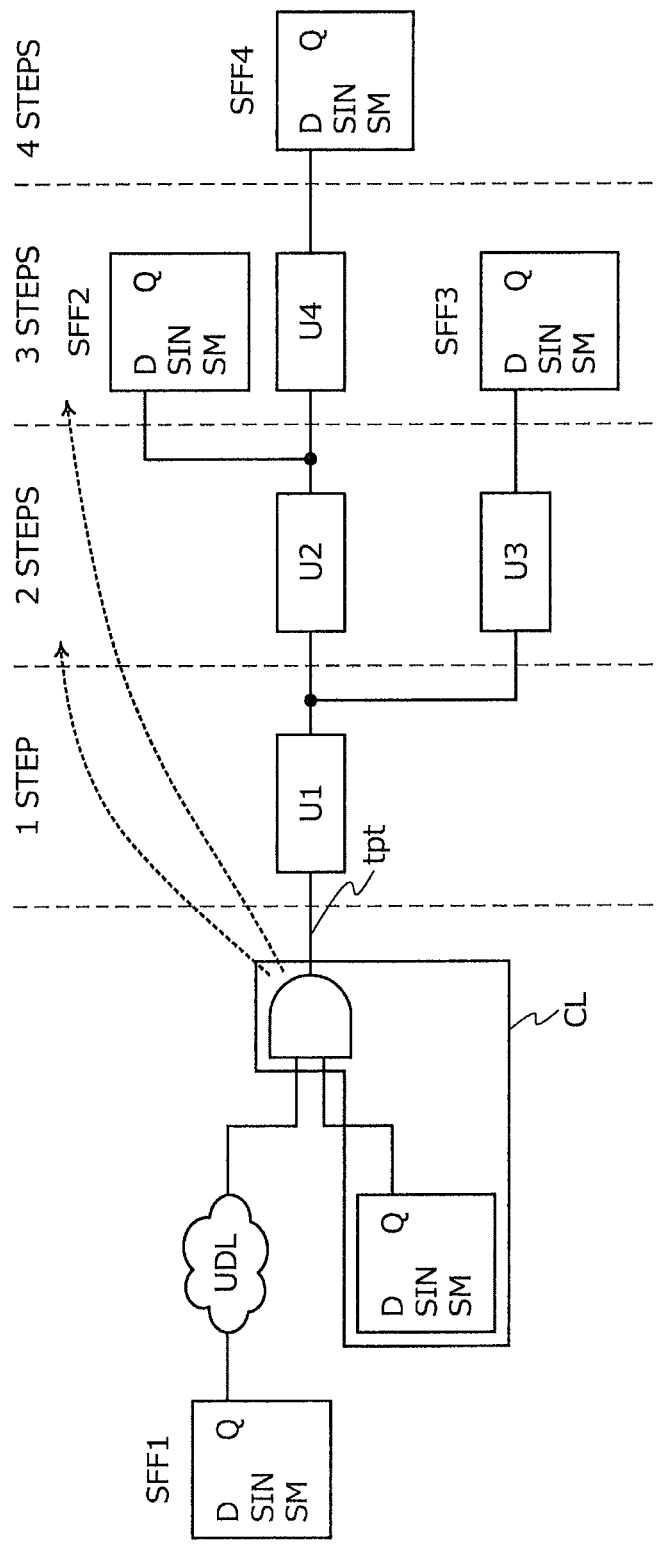
FIG. 8 is an explanatory diagram of an example of selection of a flip-flop.

FIG. 8 is an explanatory diagram of an example of selection of the flip-flop. For easy understanding of the selection made by the SFF selecting unit 503, FIG. 8 is described using a given circuit LOGIC different from the given circuit LOGIC depicted in FIG. 6. For example, the SFF selecting unit 503 searches for the flip-flop one step downstream from the control candidate tpt. In the example of FIG. 8, since the logic circuit one step downstream is only U1, the SFF selecting unit 503 then searches for a flip-flop two steps downstream from the control candidate tpt. In the example of FIG. 8, since the logic circuits two steps downstream are U2 and U3, the SFF selecting unit 503 searches for a flip-flop whose number of logic steps toward the output destination of the signal of the control candidate tpt is three steps. In the example of FIG. 8, the flip-flops SFF2 and SFF3 are searched for. The SFF selecting unit 503 selects any one among the flip-flop SFF2 and the flip-flop SFF3.

The connection information generating unit 504 generates the connection information CP indicating connection of the input data terminal of the flip-flop of the control circuit CL to be connected, to the control candidate indicated by the element tp and the output terminal of the flip-flop selected by the SFF selecting unit 503. For example, the connection information generating unit 504 sets an instance name of the selected flip-flop in the SFF name Name2 of the element tp. The connection information generating unit 504 then adds the element tp after the setting to the connection information CP. The connection information generating unit 504 deletes the element tp from the control candidate set TP_con. Thus, new connection information CP is generated. The generated connection information CP and the control candidate set TP_con after the deletion are stored to a storage device such as, for example, the RAM 403 and the disk 405.

Figure 9:
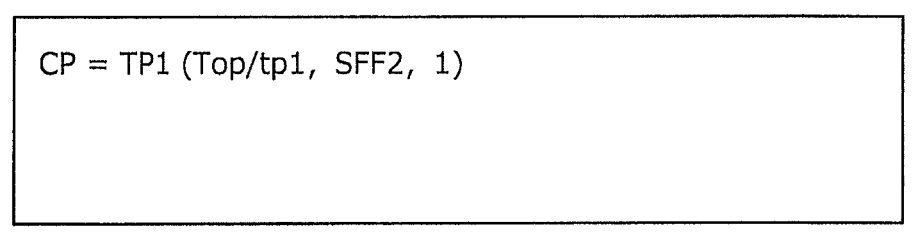

FIG. 9 is an explanatory diagram of a connection information example 1 according to the first example. The connection information generating unit 504 sets SFF2 in the SFF name Name2 of the element indicative of the control candidate TP1.

Figure 10:
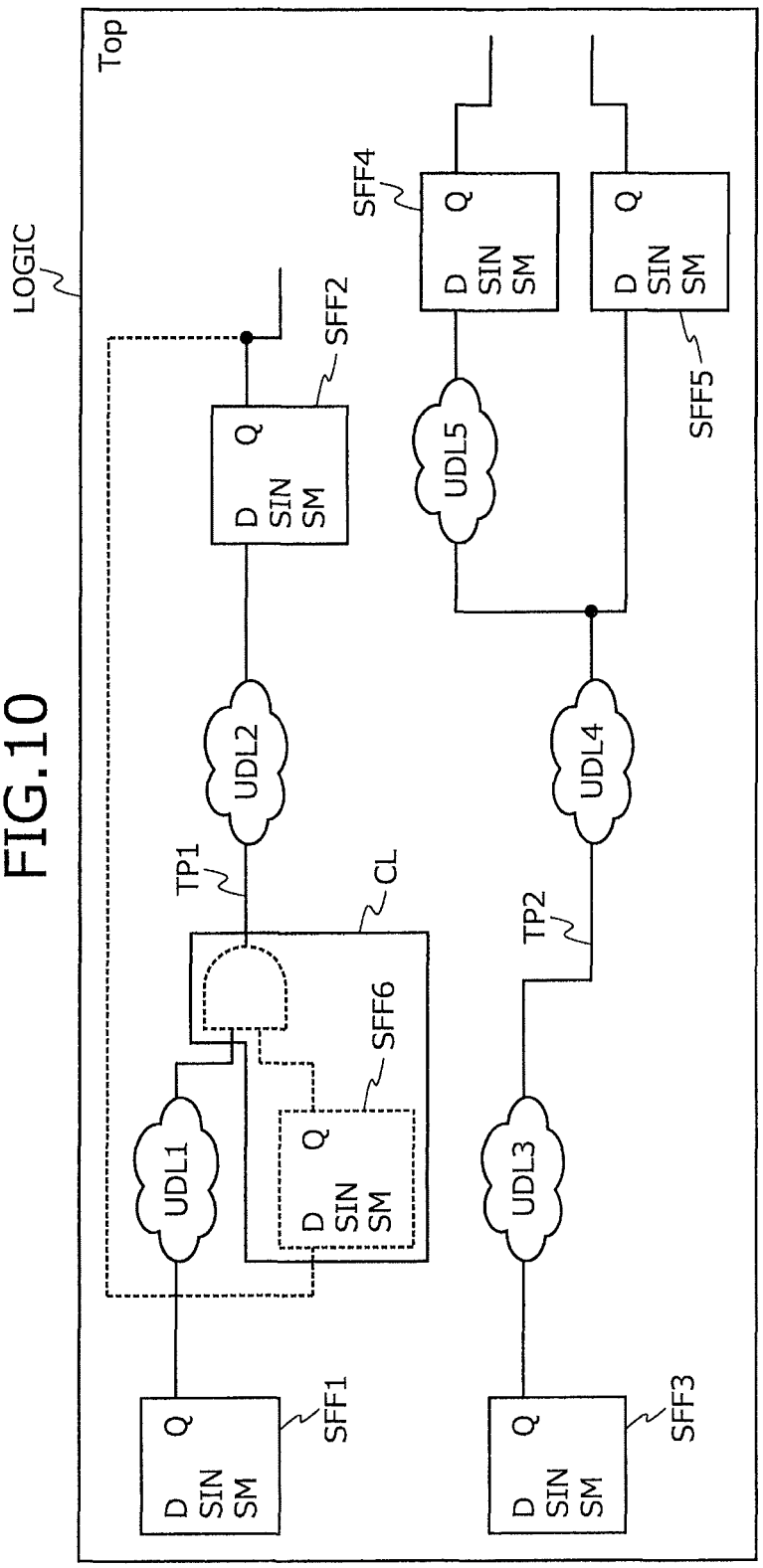
FIG. 10 is an explanatory diagram of an example of the control circuit connected to a control candidate TP1.

FIG. 10 is an explanatory diagram of an example of the control circuit connected to the control candidate TP1. In FIG. 10, the output terminal of the flip-flop SFF2 and the data input terminal of the flip-flop SFF6 of the control circuit CL connected to the control candidate TP1 are connected. The control circuit CL connected to the control candidate TP1 is connected in series between the user-defined logic UDL1 and the control candidate TP1. In practice, the control circuit CL may be connected, for example, after the flip-flop to be connected to the data input terminal of the flip-flop within the control circuit CL has been selected with respect to all control candidates.

If the elements are included in the control candidate set TP_con, the control candidate selecting unit 502 newly selects one element tp. In this case, the element indicative of the control candidate TP2 is selected. As described above, the SFF selecting unit 503 selects SFF5 with respect to the control candidate TP21; and the connection information generating unit 504 generates the connection information CP.

Figure 11:
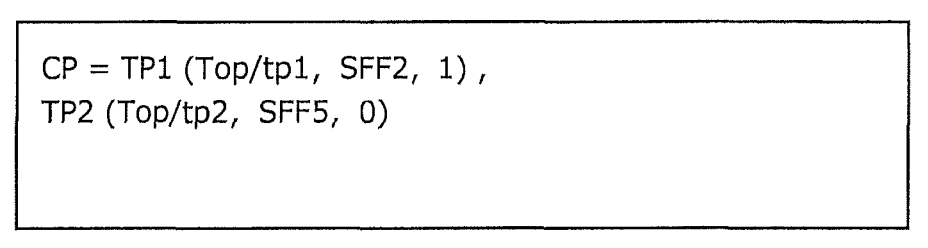

FIG. 11 is an explanatory diagram of a connection information example 2 according to the first example. For example, SFF5 is set in the SFF name Name2 of the element indicative of the control candidate TP2 within the connection information CP.

When there is no element to be selected by the control candidate selecting unit 502, the circuit information generating unit 505 generates given circuit information LOGICD2 indicative of the given circuit LOGICT obtained by connecting the control circuit CL to the given circuit LOGIC according to the connection information CP. The generated given circuit information LOGICD2 is stored in a storage device such as, for example, the RAM 403 and the disk 405.

Figure 12:
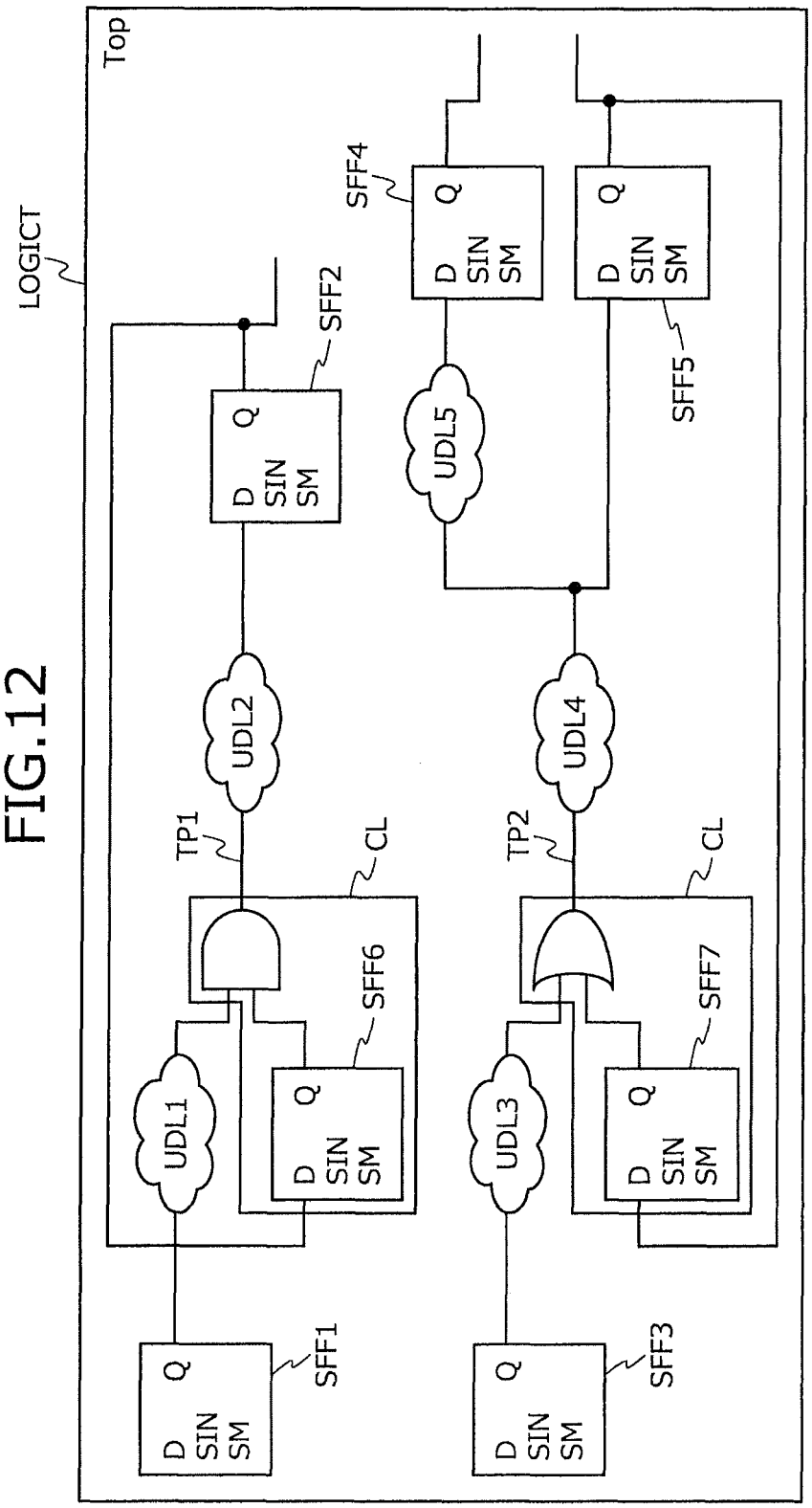
FIG. 12 is an explanatory diagram of an example of the control circuit connected to a control candidate TP2.

FIG. 12 is an explanatory diagram of an example of the control circuit connected to the control candidate TP2. In the given circuit LOGICT depicted in FIG. 12, the control circuit CL is connected in series between the user-defined logic UDL3 and the control candidate TP2. In the given circuit LOGICT, the output terminal of SFF5 is connected to the data input terminal of the flip-flop SFF7 within the control circuit CL. The circuit information generating unit 505 generates the given circuit information LOGICD2 indicative of the given circuit LOGICT.

When there is no flip-flop at the output destination, the connection information generating unit 504 generates the connection information CP indicating that the value to be input to the data input terminal of the flip-flop within the control circuit CL is fixed at the value based on the non-controlled value of the logic circuit to which the control candidate is connected. For example, the connection information generating unit 504 sets the type of the element tp in the SFF name Name2 of the element tp.

Figure 13:
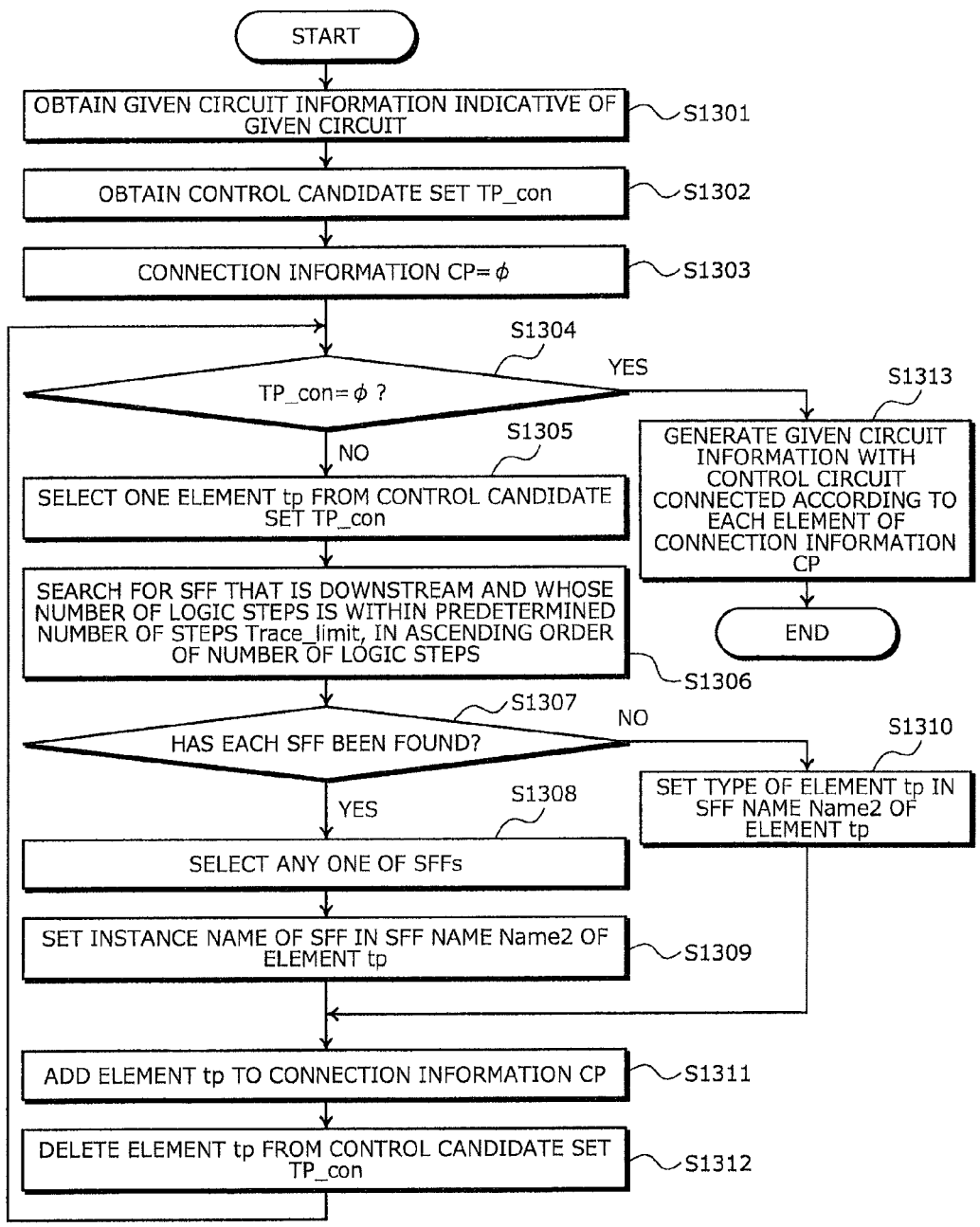
FIG. 13 is a flowchart of an example of design support processing by the circuit design support apparatus according to the first example.

FIG. 13 is a flowchart of an example of design support processing by the circuit design support apparatus according to the first example. In FIG. 13, the flip-flop is abbreviated as SFF. The circuit design support apparatus 100 obtains the given circuit information LOGICD1 indicative of the given circuit LOGIC (step S1301). The circuit design support apparatus 100 obtains the control candidate set TP_con (step S1302).

The circuit design support apparatus 100 sets the connection information CP=$\phi$ (step S1303). The circuit design support apparatus 100 judges if the control candidate set TP_con=$\phi$ is applicable (step S1304). If the control candidate set TP_con=$\phi$ is not applicable (step S1304: NO), then the circuit design support apparatus 100 selects one element tp from the control candidate set TP_con (step S1305).

The circuit design support apparatus 100 searches for a SFF that is subsequent to the logic circuit to which the control candidate tpt is connected and whose number of logic steps from a starting point is within the predetermined number of steps Trace_limit, with the control candidate tpt given as the starting point, in ascending order of the number of logic steps (step S1306). The circuit design support apparatus 100 performs a breadth-first search by which the search is made in ascending order of the number of logic steps and the search is completed when each SFF is found.

The circuit design support apparatus 100 judges if each SFF has been found (step S1307). If each SFF has been found (step S1307: YES), then the circuit design support apparatus 100 selects any one of the SFFs (step S1308). The circuit design support apparatus 100 sets the instance name of the SFF in the SFF name Name2 of the element tp (step S1309). If no SFF is found (step S1307: NO), then the circuit design support apparatus 100 sets the type of the element tp in the SFF name Name2 of the element tp (step S1310).

After step S1309 or step S1310, the circuit design support apparatus 100 adds the element tp to the connection information CP (step S1311). The circuit design support apparatus 100 deletes the element tp from the control candidate set TP_con (step S1312) and goes back to step S1304.

At step S1304, if TP_con=$\phi$ (step S1304: YES), then the circuit design support apparatus 100 generates the given circuit information LOGICD2 with the control circuit connected according to each element of the connection information CP (step S1313), completing a sequence of processing.

In the second example, the output of the flip-flop for observing or the flip-flop having the least number of logic steps from the control candidate among the flip-flops subsequent to the control candidate is connected to the data input terminal of the flip-flop within the control circuit CL to be connected to the control candidate. Since this makes it possible to control the value of the control candidate by the value of the flip-flop highly likely to be arranged closest to the control candidate among the flip-flops having little effect on other circuits, other signal lines, etc., the delay fault detection accuracy can be improved. In the second example, functions and components identical to those as depicted in the first example are given the same reference numerals used in the first example and detailed description thereof is omitted.

Figure 14:
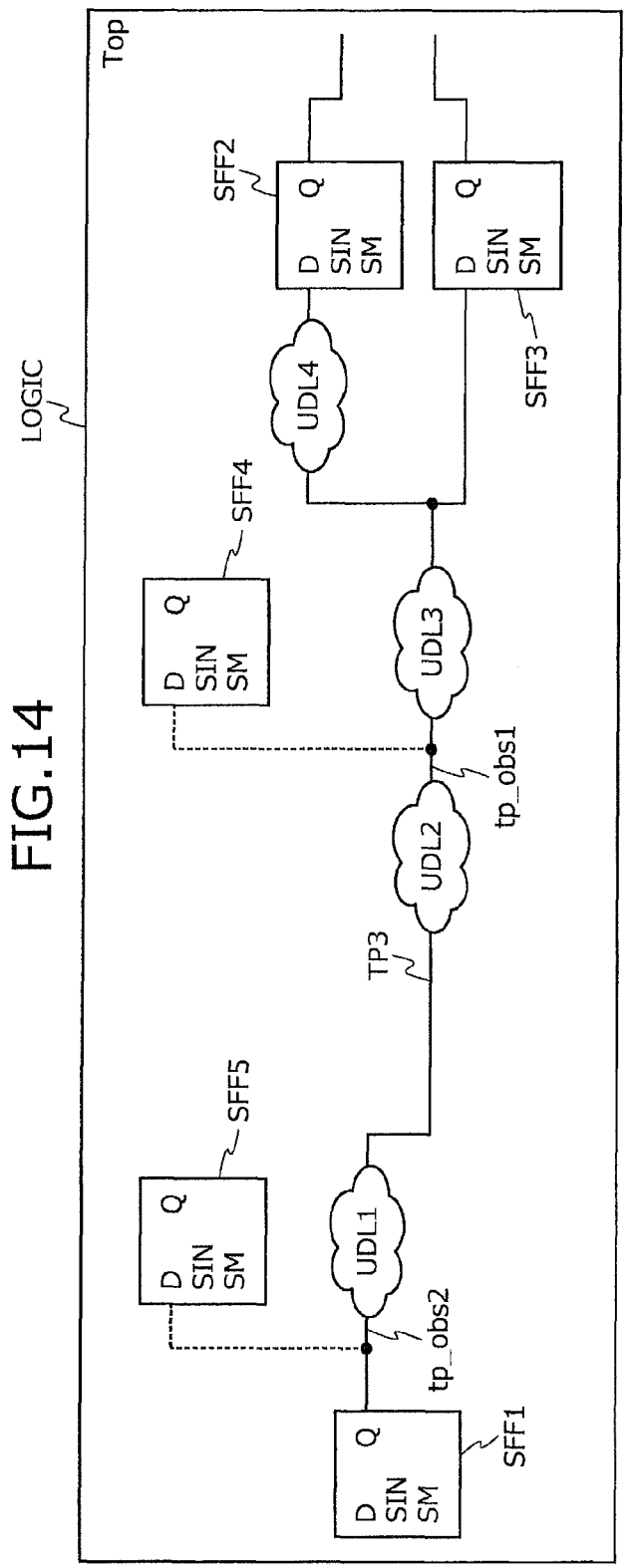
FIG. 14 is an explanatory diagram of a given circuit example according to a second example.

FIG. 14 is an explanatory diagram of a given circuit example according to the second example. FIG. 15 is an explanatory diagram of an example of a control candidate set, according to the second example. The given circuit LOGIC has the user-defined logics UDL1 to UDL4 and the flip-flops SFF1 to SFF5. Two flip-flops connected by a dotted line represent the flip-flops that are for observing and that are to be connected to the signal line to be observed. The signal line to be observed is referred to as an observation candidate. With the flip-flop connected to the observation candidate, the value of the observation candidate is observed by the flip-flop. The control candidate set TP_con includes an element indicative of the control candidate TP3.

The acquiring unit 501 obtains the control candidate set TP_con and an observation candidate set TP_obs having the identification information that indicates the observation candidate as the element thereof. The acquiring unit 501 may obtain the control candidate set TP_con and the observation candidate set TP_obs input by way of the input device 407. The acquiring unit 501 may obtain the control candidate set TP_con and the observation candidate set TP_obs stored in the storage device such as the RAM 403 and the disk 405. The acquiring unit 501 may obtain the control candidate set TP_con and the observation candidate set TP_obs from another device by way of the network NET.

FIG. 16 is an explanatory diagram of an example of an observation candidate set. Each element includes, for example, the absolute path of the net name of the observation candidate. The absolute path as used herein is the information of the a module Top indicative of the given circuit LOGIC as a whole included in the given circuit information LOGICD1, the instance name of the circuit as the output source of the observation candidate, and the net name of the observation candidate, arranged in that order.

The control candidate selecting unit 502 selects any one element tp included in the control candidate set TP_con. In this example, the element indicative of the control candidate TP3 is selected as the element tp.

The SFF selecting unit 503 selects the flip-flop having the least number of logic steps from the control candidate tpt, among the flip-flops that are for observing and that are to be connected to the observation candidate, and the flip-flops at the output destination of the signal of the control candidate tpt within the given circuit LOGIC.

The SFF selecting unit 503 selects any one flip-flop among the flip-flops whose number of logic step is within the predetermined number of steps Trace_limit, among the flip-flops for observing and the flip-flops at the output destination. A flip-flop for observing is not necessarily required to be at the subsequent step of the control candidate tpt. For this reason, the SFF selecting unit 503 selects the observation candidate having the least number of logic steps among the observation candidates whose number of logic steps is within the predetermined number of steps Trace_limit, among the observation candidates indicated by the observation candidate set TP_obs. The SFF selecting unit 503 selects the observation candidate having the least number of logic steps among the observation candidates within the predetermined number of steps Trace_limit, among the observation candidates. Among the selected observation candidate and the selected flip-flop, the SFF selecting unit 503 selects the one having a lesser number of logic steps. In the example of FIG. 14, since the observation candidate tp_obs1 and the observation candidate tp_obs2 have the least number of logic steps, the SFF selecting unit 503 selects the observation candidate tp_obs1.

The connection information generating unit 504 sets the instance name of the element indicative of the selected signal line to be observed or the selected flip-flop in the SFF name Name2 of the element tp. The connection information generating unit 504 then adds the element tp to the connection information CP. The connection information generating unit 504 deletes the element tp from the control candidate set TP_con.

FIG. 17 is an explanatory diagram of a connection information example according to the second example. The element indicative of the control candidate TP3 is added to the connection information CP. In the example of FIG. 17, the element indicative of the observation candidate tp_obs1 is set in the SFF name Name2 of the element indicative of the control candidate TP3.

Figure 18:
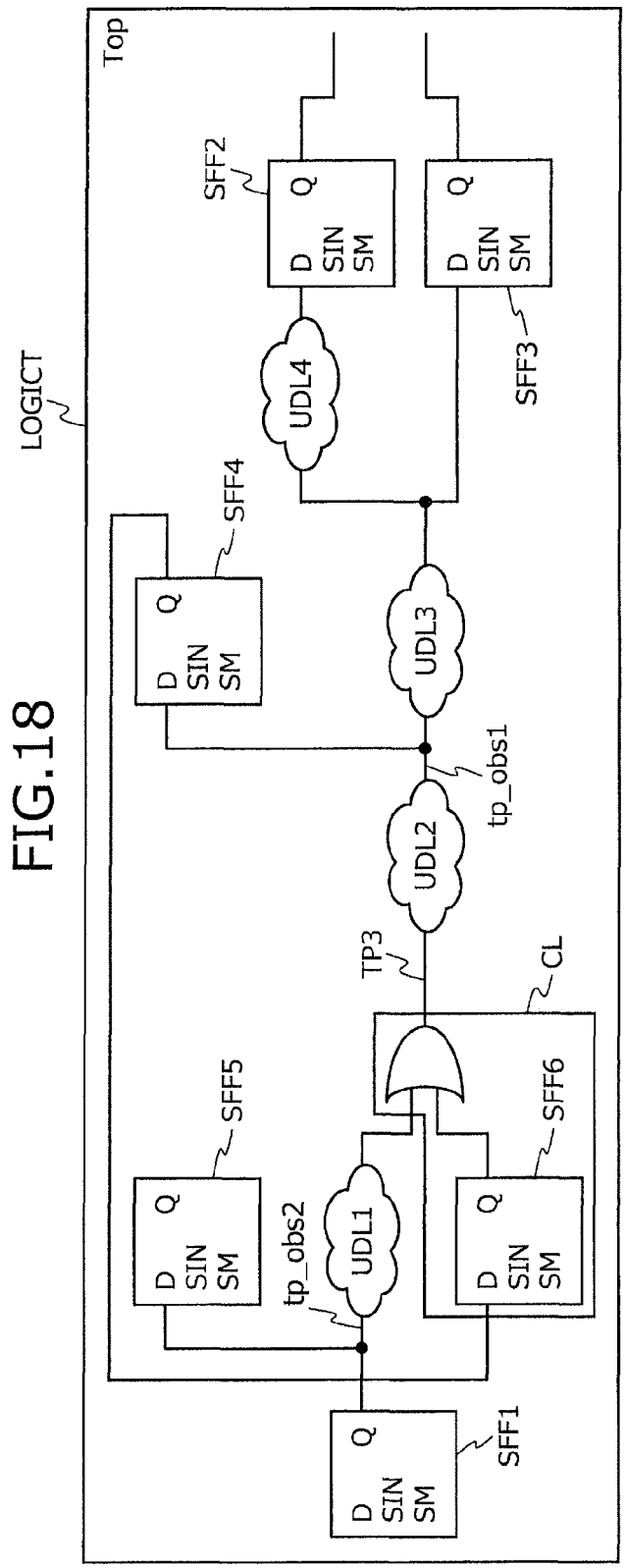
FIG. 18 is an explanatory diagram of an example of the control circuit connected to a control candidate TP3.

FIG. 18 is an explanatory diagram of an example of the control circuit connected to the control candidate TP3. In the given circuit LOGICT depicted in FIG. 18, the flip-flop SFF4 is connected to the observation candidate tp_obs1 and the flip-flop SFF5 is connected to the observation candidate tp_obs2. The data input terminal of the SFF6 within the control circuit CL connected to the control candidate TP3 is connected to the output terminal of the SFF4 that is for observing and connected to the observation candidate tp_obs1. The circuit information generating unit 505 generates the given circuit information LOGICD2 indicative of the given circuit LOGICT. Since the processing by the circuit information generating unit 505 is the same as in the first example, detailed description is omitted.

If there is no signal line that is to be observed or no SFF at the output destination within the predetermined number of steps Trace_limit, the connection information generating unit 504 sets the type of the element tp in the SFF name Name2 of the element tp, in the same manner as in the first example.

Figure 19:
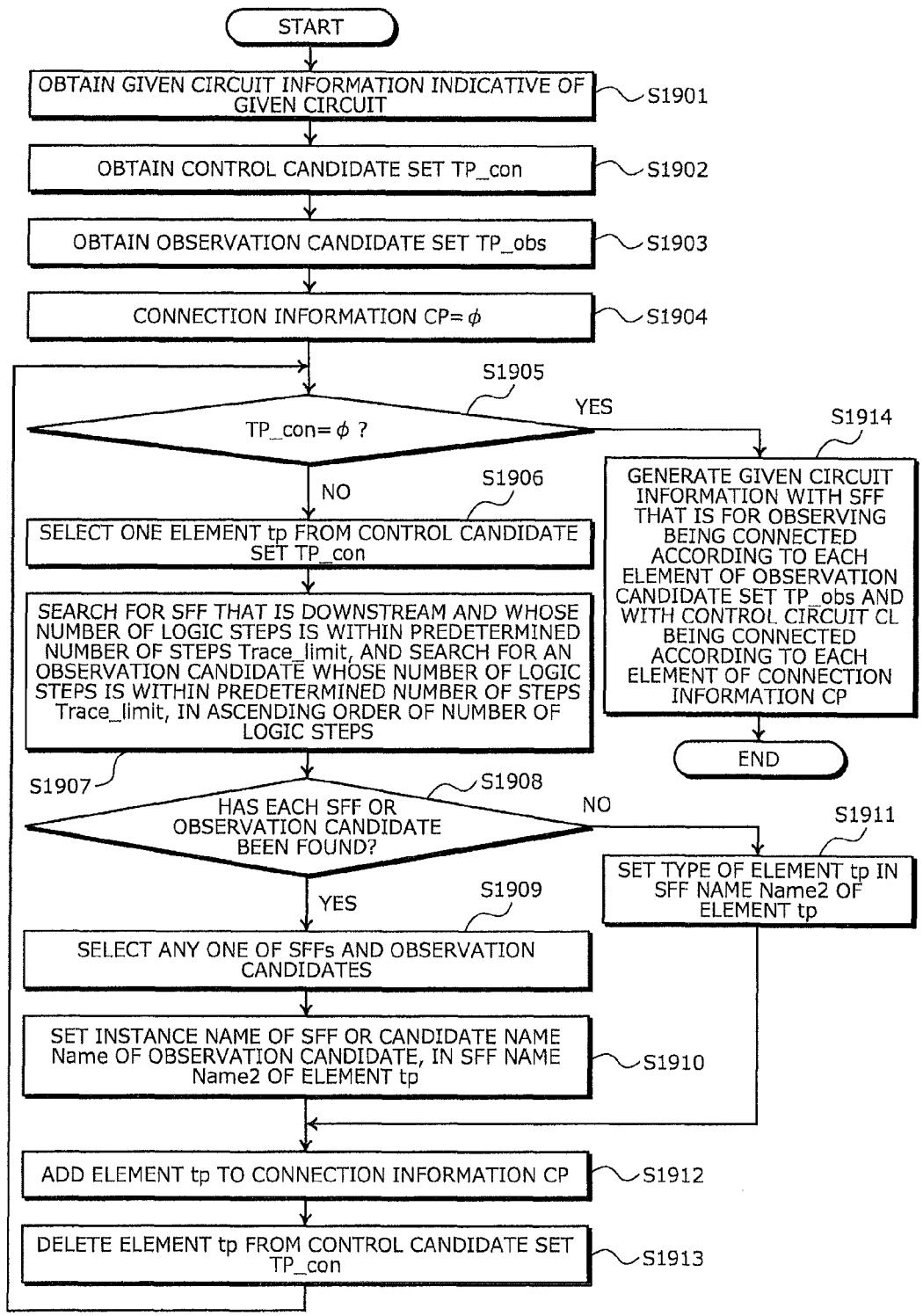
FIG. 19 is a flowchart of an example of design support processing by the circuit design support apparatus according to the second example.

FIG. 19 is a flowchart of an example of design support processing by the circuit design support apparatus according to the second example. In FIG. 19, the flip-flop is abbreviated as SFF. The circuit design support apparatus 100 obtains the given circuit information LOGICD1 indicative of the given circuit LOGIC (step S1901). The circuit design support apparatus 100 obtains the control candidate set TP_con (step S1902). The circuit design support apparatus 100 obtains the observation candidate set TP_obs (step S1903).

The circuit design support apparatus 100 sets the connection information CP=φ (step S1904). The circuit design support apparatus 100 judges if the control candidate set TP_con=φ is applicable (step S1905). If the control candidate set TP_con=φ is not applicable (step S1905: NO), then the circuit design support apparatus 100 selects one element tp from the control candidate set TP_con (step S1906).

The circuit design support apparatus 100 searches for a SFF that is subsequent to the control candidate tpt and whose number of logic steps from the control candidate tpt is within the predetermined number of steps Trace_limit, and searches for an observation candidate whose number of logic steps is within the predetermined number of steps Trace_limit, in ascending order of the number of logic steps (step S1907). At step S1907, the circuit design support apparatus 100 performs a breadth-first search by which the search is made in ascending order of the number of logic steps and the search is completed when each SFF is found.

The circuit design support apparatus 100 judges if each SFF or observation candidate has been found (step S1908). If each SFF or observation candidate has been found (step S1908: YES), then the circuit design support apparatus 100 selects any one of the SFFs and the observation candidates (step S1909). The circuit design support apparatus 100 sets the instance name of the SFF or the candidate name Name of the observation candidate, in the SFF name Name2 of the element tp (step S1910). If no SFF or observation candidate is found (step S1908: NO), then the circuit design support apparatus 100 sets the type of the element tp in the SFF name Name2 of the element tp (step S1911).

After step S1910 or step S1911, the circuit design support apparatus 100 adds the element tp to the connection information CP (step S1912). The circuit design support apparatus 100 deletes the element tp from the control candidate set TP_con (step S1913) and goes back to step S1905.

At step S1905, if the control candidate set YP_con=φ (step S1905: YES), then the circuit design support apparatus 100 moves to step S1914. The circuit design support apparatus 100 generates the given circuit information LOGICD2 with the SFF that is for observing being connected according to each element of the observation candidate set TP_obs and with the control circuit CL being connected according to each element of the connection information CP (step S1914), completing a sequence of processing.

Figure 20:
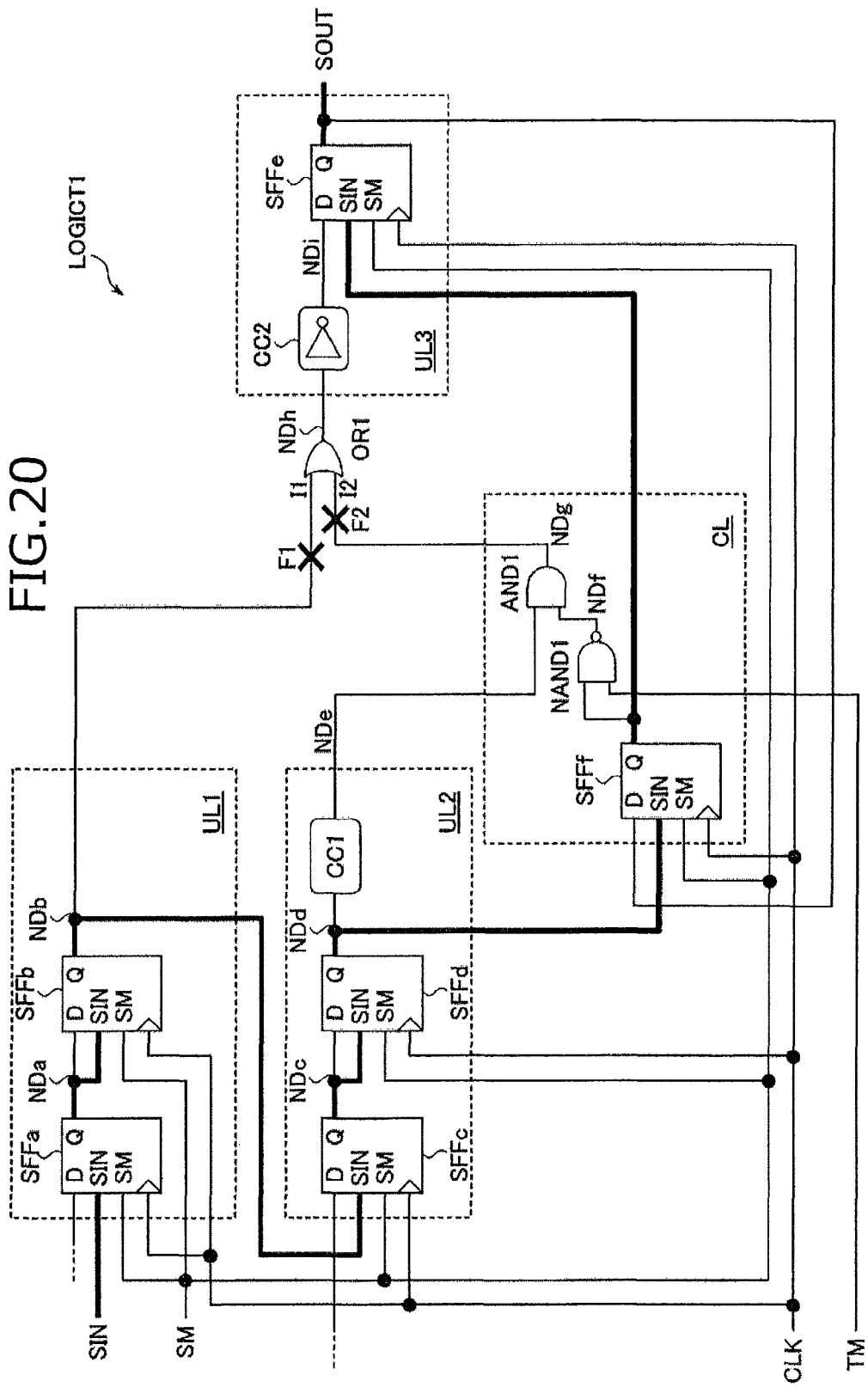
FIG. 20 is an explanatory diagram of an example of a logic circuit capable of fixing at 0, the value of a signal to be controlled.
Figure 21:
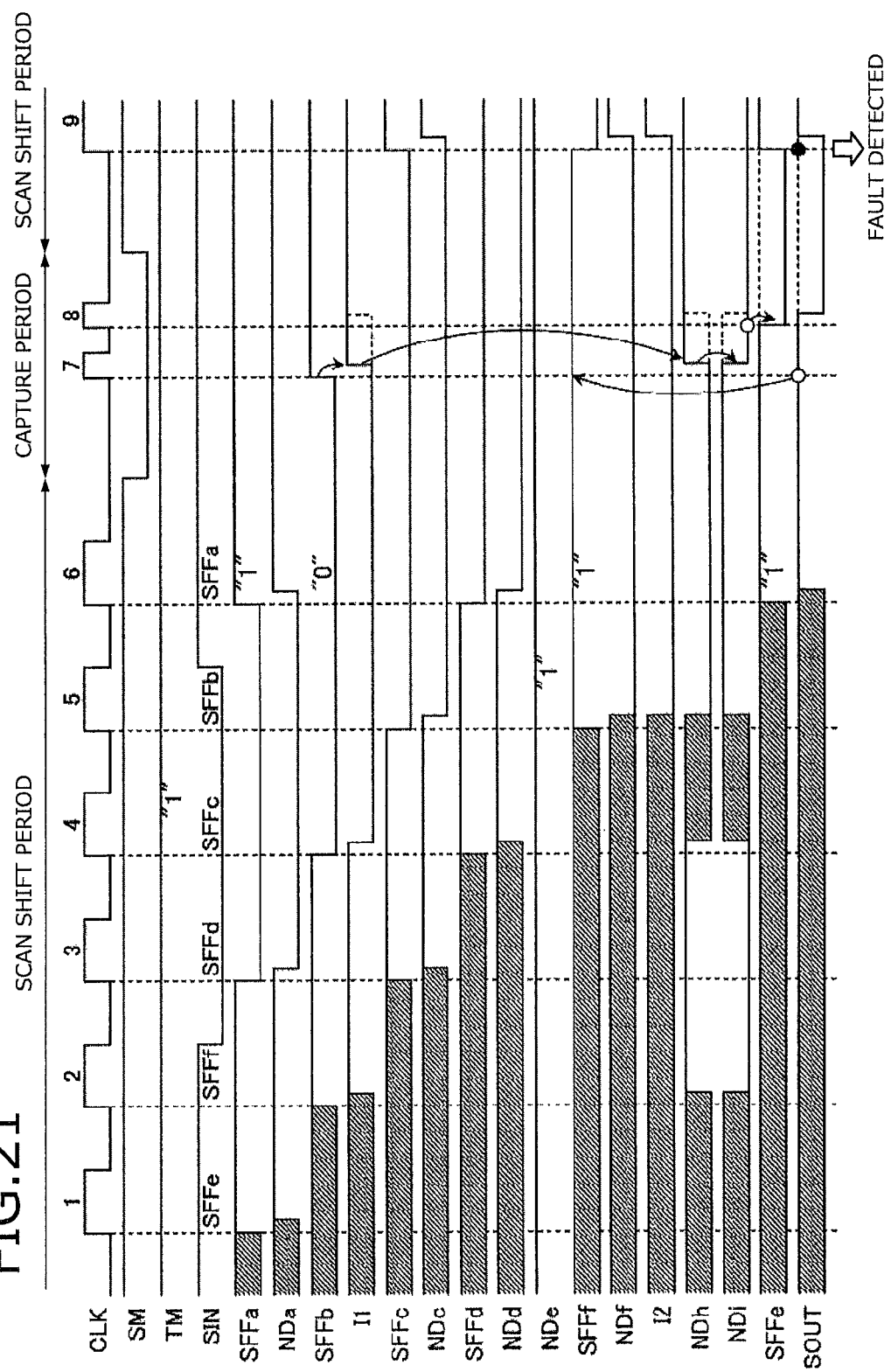
FIG. 21 is an explanatory diagram of an example of a test to detect a delay fault F1.
Figure 22:
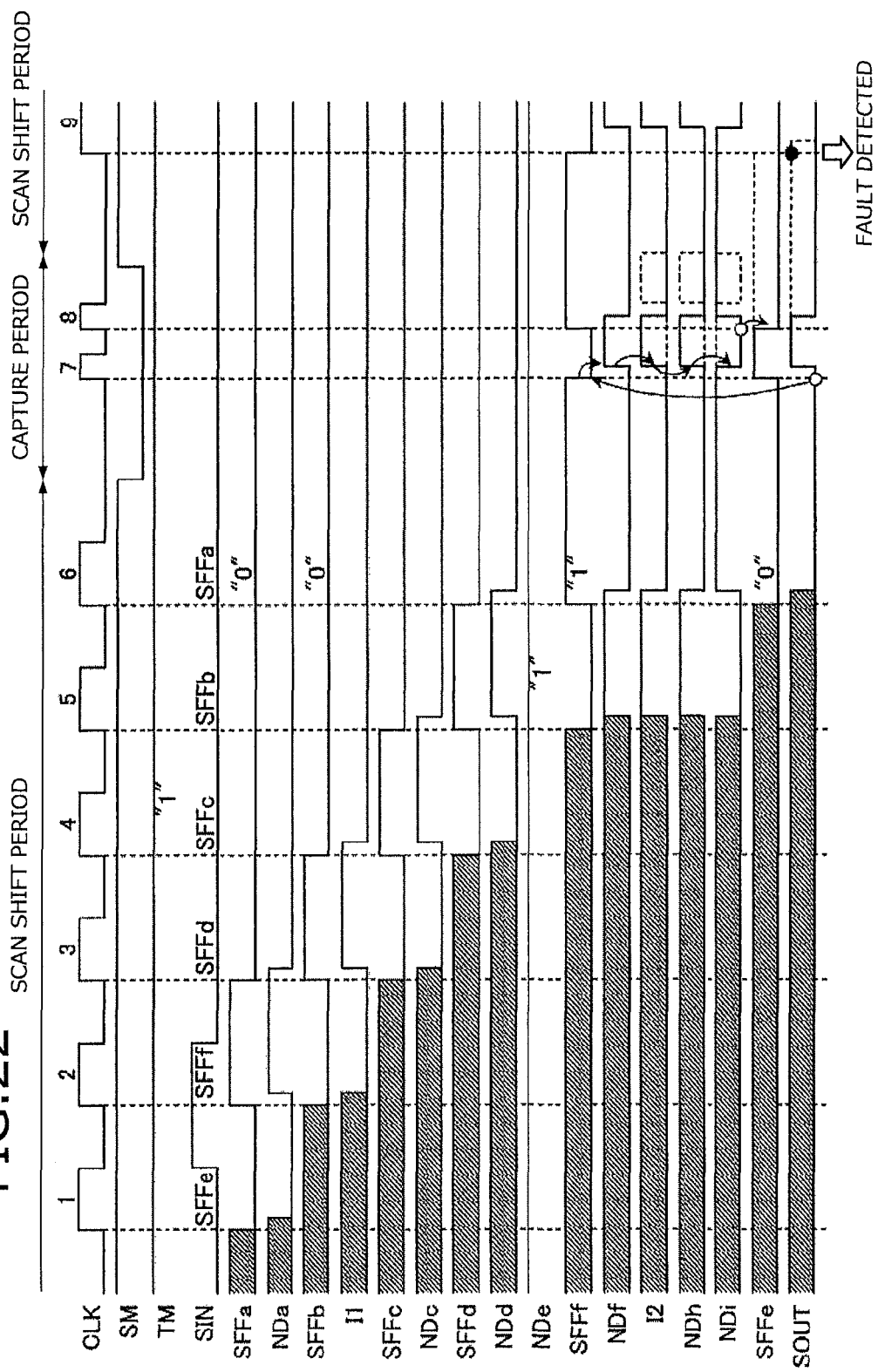
FIG. 22 is an explanatory diagram of an example of the test to detect a delay fault F2.

Examples will be described of a test to detect the delay fault. FIGS. 20 to 22 describe an example of a test to detect the delay fault in the logic circuit capable of fixing at 0, the value of the signal to be controlled and FIGS. 23 to 25 describe an example of the test to detect the delay fault in the logic circuit capable of fixing at 1, the value of the signal to be controlled.

FIG. 20 is an explanatory diagram of the example of the logic circuit capable of fixing at 0, the value of the signal to be controlled. The logic circuit LOGICT1 has user logics UL1, UL2, and UL3, the OR circuit OR1, and the control circuit CL. The output terminal of the user logic UL1 is connected to the input terminal I1 of the OR circuit OR1. The output terminal of the user logic UL2 is connected to the input terminal I2 of the OR circuit OR1 by way of the control circuit CL. The output terminal of the OR circuit OR1 is connected to the input terminal of the user logic UL3. The signal input to the input terminal I1 and the signal input to the input terminal I2 are output to the outside of the logic circuit LOGICT1 by way of the OR circuit OR1.

With the value of the signal to be input to the input terminal I2 fixed at 0, a changing of the value of the signal to be input to the input terminal I1 from 0 to 1 or from 1 to 0 enables detection of the delay fault F1 of a signal path that includes the input terminal I1.

With the value of the signal to be input to the input terminal I1 fixed at 0, a changing of the value of the signal to be input to the input terminal I2 from 0 to 1 or from 1 to 0 enables detection of the delay fault F2 of a signal path that includes the input terminal I2.

FIG. 21 is an explanatory diagram of the example of the test to detect the delay fault F1. The operation depicted in FIG. 21 is implemented by the execution of a fault detecting program by a tester that is capable of testing the logic circuit LOGICT1. In timing charts depicted in FIG. 21 and thereafter, first to sixth clock cycles and a ninth clock cycle denote a scan shift period during which a scan mode input SM is set to 1. Seventh and eighth clock cycles denote a capture period during which the scan mode input SM is set to 0. The length of the seventh clock cycle is set according to the delay time of the signal path for determining the delay fault F1 or F2. In other words, if the delay time of the signal path is longer than the length of the seventh clock cycle, occurrence of the delay fault F1 or F2 is detected. The length of the seventh clock cycle is the period from the rising edge of the seventh clock CLK until the rising edge of the eighth clock CLK. To transmit the value (transition edge) to be output from a flip-flop SFFf to the OR circuit OR1, a test mode terminal TM is set to 1 during the test mode. In the seventh to the ninth clock cycles, the waveform indicated by a dashed line denotes the operation when there is the delay fault.

In this example, to set desired values in an SFFe, the SFFf, an SFFd, an SFFc, an SFFb, and an SFFa, at the first to the sixth clock cycles, 1, 1, 0, 0, 0, and 1 are supplied in sequence to a scan input SIN. The flip flop names shown on the waveform of the scan input SIN denote correspondence to the values to be set at the sixth clock cycle. At the sixth clock cycle immediately before the capture period, the flip-flops SFFb, SFFa, SFFf, and SFFe are set to 0, 1, 1, and 1, respectively.

Namely, at the sixth clock cycle, the flip-flops SFFb and SFFa connected in series to the input terminal I1 of the OR circuit OR1 by way of the data input D hold values opposite to each other. This makes it possible to change the value held by the flip-flop SFFb from 0 to 1 and change the value of the input terminal I1 of the OR circuit OR1 from 0 to 1, at the seventh clock cycle of the capture period.

At the sixth clock cycle, the flip-flops SFFf and SFFe connected in series to the input terminal I2 of the OR circuit OR1 by way of a NAND circuit NAND1 and an AND circuit AND1 and by way of the data input D hold values identical to each other. Consequently, at the seventh clock cycle of the capture period, the value held by the flip-flop SFFf can be maintained at 1, using the value held by the flip-flop SFFe one clock cycle before. Therefore, the value can be maintained at 0 for the input terminal I2 of the OR circuit OR1 connected to an output node of the flip-flop SFFf. The value held by the flip-flop SFFf is inverted by the NAND circuit NAND1 and is transmitted to a node NDf and the input terminal I2 of the OR circuit OR1.

When there is no delay fault F1, the change of the value held by the flip-flop SFFb is immediately transmitted to the input terminal I1 of the OR circuit OR1 and an output node NDh of the OR circuit OR1. In response to the change of the output node NDh from 0 to 1, a circuit CC2 immediately changes an output node NDi from 1 to 0. For this reason, at the eighth clock cycle of the capture period, the flip-flop SFFe latches 0 and outputs the latched 0 to a scan out terminal SOUT. At the ninth clock cycle of the scan shift period, the tester, by reading in 0 as the value of the signal from the scan out terminal SOUT, detects absence of the delay fault F1.

In an actual circuit, the output of the flip-flop SFFe is often connected to the scan out terminal SOUT by way of plural flip-flops. In this case, the scan out terminal SOUT is connected to, for example, an output Q of the last flip-flop held by the shift register as a scan chain and presence or absence of the delay fault F1 is determined in the clock cycle subsequent to the ninth clock cycle.

On the other hand, when there is the delay fault F1, the change of the value held by the flip-flop SFFb is transmitted belatedly to the input terminal I1 of the OR circuit OR1, the output node NDh of the OR circuit OR1, or the output node NDi of the circuit CC2, as depicted by a dashed line. When, due to the signal delay, the flip-flop SFFe cannot latch 0 of the node NDi at the eighth clock cycle of the capture period, the scan out terminal SOUT is maintained at 1. The tester, by reading in 1 as the value of the signal from the scan out terminal SOUT at the ninth clock cycle of the scan shift period, detects the presence of the delay fault F1.

FIG. 22 is an explanatory diagram of the example of the test to detect the delay fault F2. The operation depicted in FIG. 22 is implemented by an execution of the fault detecting program by the tester. This test is practiced to detect the delay fault F2 depicted in FIG. 20. Detailed description of identical operations in FIG. 21 is omitted.

In this example, at the first to the sixth clock cycles, 0, 1, 0, 0, 0, and 0 are supplied in sequence to the scan input SIN. At the sixth clock cycle, the flip-flops SFFb, SFFa, SFFf, and SFFe are set to 0, 0, 1, and 0, respectively. Namely, at the sixth clock cycle, the flip-flops SFFb and SFFa connected in series to the input terminal I1 of the OR circuit OR1 hold values identical to one another. The flip-flops SFFf and SFFe connected in series to the input terminal I2 of the OR circuit OR1 by way of the NAND circuit NAND1 and the AND circuit AND1 hold values opposite to one another.

Thus, at the seventh clock cycle of the capture period, the value held by the flip-flop SFFf can be changed from 1 to 0, using the value held by the flip-flop SFFe one clock cycle before. The value held by the flip-flop SFFe is inverted by the NAND circuit NAND1. Namely, at the seventh clock cycle, with the input terminal I1 of the OR circuit OR1 maintained at 0, the input terminal I2 of the OR circuit OR1 can be changed from 0 to 1.

When there is no delay fault F2, the change of the value held by the flip-flop SFFf is immediately transmitted to the input terminal I2 and the output node NDh of the OR circuit OR1. In the same manner as depicted in FIG. 21, the flip-flop SFFe latches 0 at the eighth clock cycle and the tester, by reading in 0 as the value of the signal from the scan out terminal SOUT at the ninth clock cycle, detects the absence of the delay fault F2.

On the other hand, if the delay fault F2 has occurred, the change of the value held by the flip-flop SFFf is transmitted belatedly to the input terminal I2 of the OR circuit OR1, the output node NDh of the OR circuit OR1, or the output node NDi of the circuit CC2, as depicted by a dashed line. If the flip-flop SFFe cannot latch 0 of the node NDi at the eighth clock cycle, the scan out terminal SOUT is maintained at 1. The tester, by reading in 1 as the value of the signal from the scan out terminal SOUT at the ninth clock cycle of the scan shift period, detects the presence of the delay fault F1.

Further, an integrated semiconductor circuit LSI can be provided that can detect the delay fault F1 of the signal path including the input terminal I1 of the logic circuit OR1 and the delay fault F2 of the signal path including the input terminal I2 of the logic circuit OR1 by one control point CP. The data output Q of the flip-flop SFFf is connected to the AND circuit AND1 by way of the NAND circuit NAND1 controlled by the test mode signal TM. This makes it possible to prevent the value of the data output Q of the flip-flop SFFf from being transmitted to the AND circuit AND1 during the system mode. As a result thereof, the logic circuit LOGICT1 can be prevented from malfunctioning.

With the value of the signal input to the input terminal I2 fixed at 0 and with the value of the signal input to the input terminal I1 caused to transition from 0 to 1 or from 1 to 0, it is made possible to detect the delay fault F1 of the signal path that includes the input terminal I1.

With the value of the signal input to the input terminal I1 fixed at 0 and with the value of the signal input to the input terminal I2 caused to transition from 0 to 1 or from 1 to 0, it is made possible to detect the delay fault F2 of the signal path that includes the input terminal I2.

Figure 23:
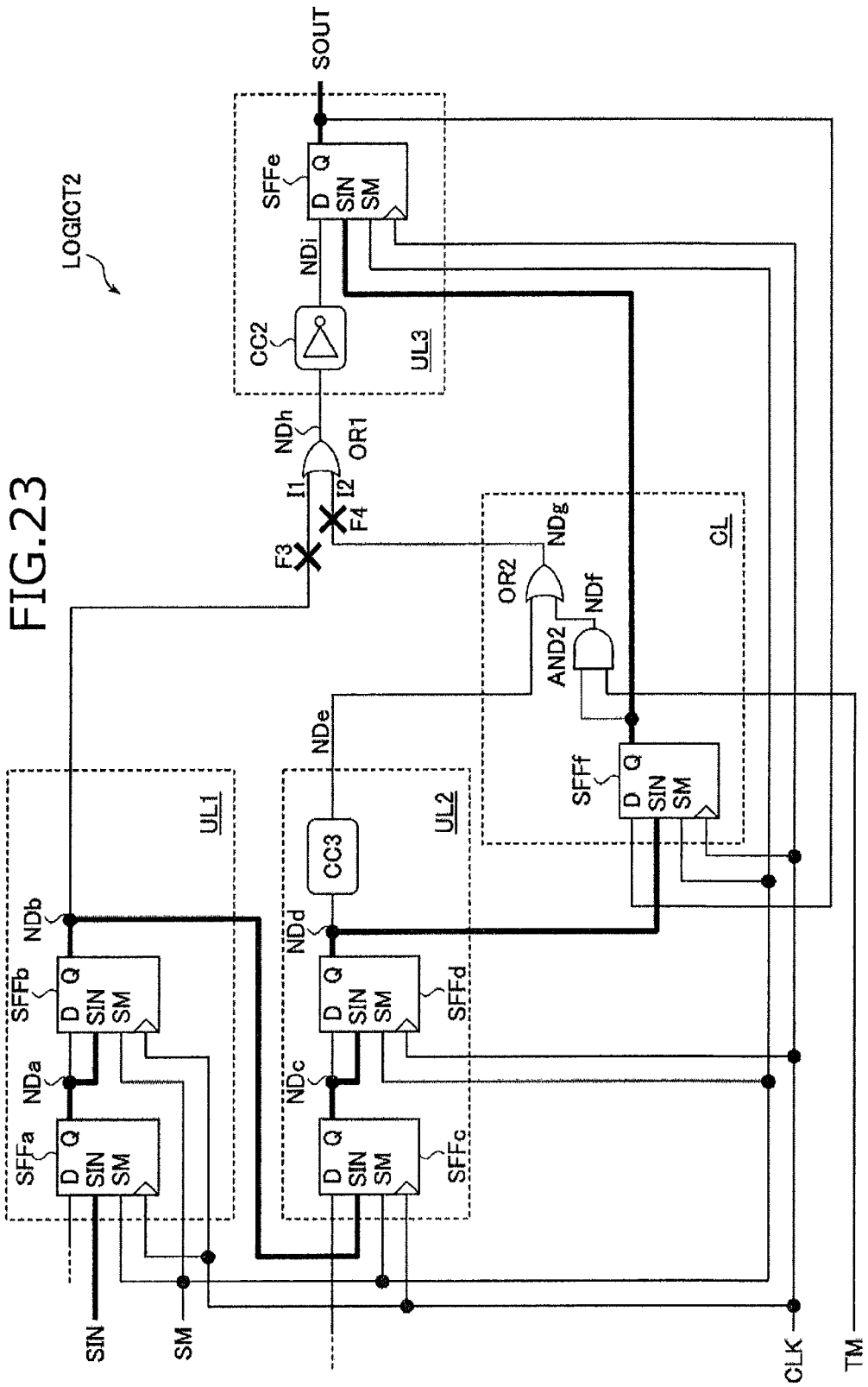
FIG. 23 is an explanatory diagram of an example of the logic circuit capable of fixing at 1, the value of the signal to be controlled.

FIG. 23 is an explanatory diagram of an example of the logic circuit capable of fixing at 1, the value of the signal to be controlled. A logic circuit LOGICT2 of this example has a circuit CC3 in place of the circuit CC1 depicted in FIG. 20. The control point CP has an AND circuit AND2 in place of the NAND circuit NAND1 depicted in FIG. 20 and an OR circuit OR2 in place of the AND circuit AND1 depicted in FIG. 20. Other components of the logic circuit LOGICT2 are the same as those depicted in FIG. 20.

It is assumed that the value of an output node NDe of the circuit CC3 is likely to become 0. In other words, during the operation of the user logic UL2, the probability of the value of the signal of the node NDe becoming 0 is sufficiently higher than that of the value of the signal of the node NDe becoming 1. The OR circuit OR2 of the control circuit CL is disposed to make it possible to set to 1, the value of the signal to be input to the input terminal I2 of the OR circuit OR1 when the value of the signal from the output terminal of the circuit CC3 is set to 0.

During the test mode (TM=1), a signal transmission function of the AND circuit AND2 becomes effective and the AND circuit AND2 outputs the value of the output Q of the flip-flop SFFf to the OR circuit OR2. On the other hand, during the system mode (TM=0), the signal transmission function of the AND circuit AND2 becomes ineffective and the value of the output node NDf of the AND circuit AND2 is fixed at 0. This makes it possible to prevent the value of the data output Q of the flip-flop SFFf, which operates according to the value received at the data input D, from being transmitted to the OR circuit OR2 and to prevent the user logic UL3, etc., from malfunctioning, during the system mode. By the AND circuit AND2 outputting 0 to the node NDf, the value of the node NDe as the output of the circuit CC3 is transmitted to the OR circuit OR1 by way of the OR circuit OR2. Thus, by connecting the flip-flop SFFf to the OR circuit OR2 by way of the AND circuit AND2 controlled by the test mode signal TM, the malfunction can be prevented due to the operation of the flip-flop SFFf during the system mode.

Figure 24:
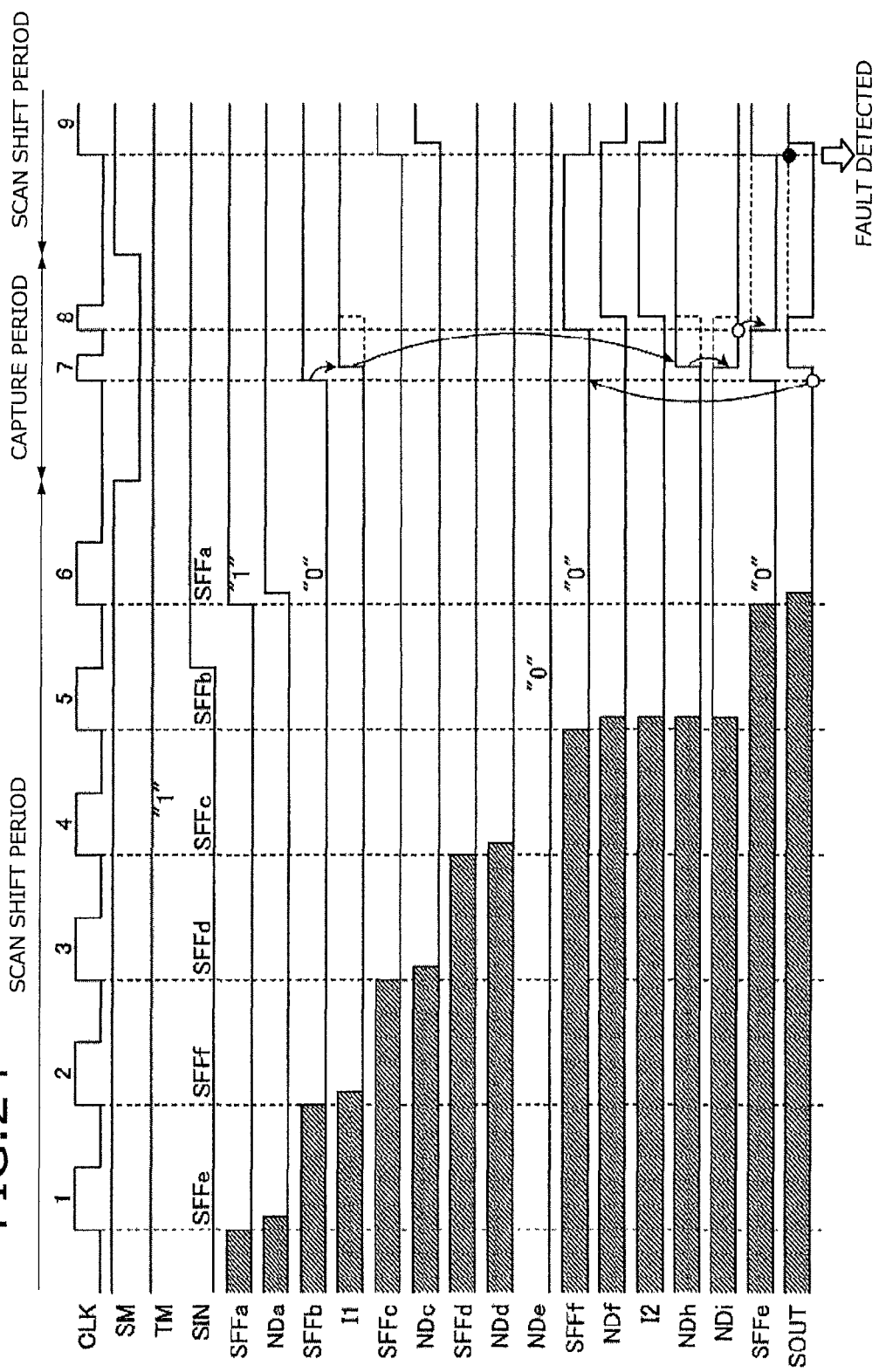
FIG. 24 is an explanatory diagram of an example of the test to detect a delay fault F3.

FIG. 24 is an explanatory diagram of an example of the test to detect a delay fault F3. The operation depicted in FIG. 24 is implemented by an execution of the fault detecting program by the tester. In this example, at the first to the sixth clock cycles, 0, 0, 0, 0, 0, and 1 are supplied in sequence to the scan input SIN. At the sixth clock cycle, the flip-flops SFFb, SFFa, SFFf, and SFFe are set to 0, 1, 0, and 0, respectively. Namely, at the sixth clock cycle, the flip-flops SFFb and SFFa that are connected in series to the input terminal I1 of the OR circuit OR1 hold values that are opposite to one another. This makes it possible to change the value held by the flip-flop SFFb from 0 to 1 and to change the value of the input terminal I1 of the OR circuit OR1 from 0 to 1, at the seventh clock cycle of the capture period.

At the sixth clock cycle, the flip-flops SFFf and SFFe that are connected in series to the input terminal I2 of the OR circuit OR1 by way of the AND circuit AND2 and the OR circuit OR2 hold values that are identical to one another. Thus, at the seventh clock cycle of the capture period, the value held by the flip-flop SFFf can be maintained at 0, using the value held by the flip-flop SFFe one clock cycle before. Since the control circuit CL has the AND circuit AND2 in place of the NAND circuit NAND1 depicted in FIG. 20, the flip-flops SFFf and SFFe are set to 0. The control circuit CL makes it possible to maintain at 0, the value of the signal to be input to the input terminal I2 of the OR circuit OR1 connected to the output terminal of the flip-flop SFFf.

When there is no delay fault F3, the change of the value held by the flip-flop SFFb immediately appears as the signal change of the output node NDi. At the eighth clock cycle of the capture period, the flip-flop SFFe latches 0 and outputs the latched 0 to the scan out terminal SOUT. The tester, by reading in 0 as the value of the signal from the scan out terminal SOUT, detects the absence of the delay fault F3.

On the other hand, if the delay fault F3 has occurred, the change of the value held by the flip-flop SFFb is transmitted belatedly to the node NDi. When the flip-flop SFFe cannot latch 0 as the value of the output node NDi at the eighth clock cycle, the value of the signal from the scan out terminal SOUT is maintained at 1. The tester, by reading in 1 as the value of the signal from the scan out terminal SOUT, detects the presence of the delay fault F3.

Figure 25:
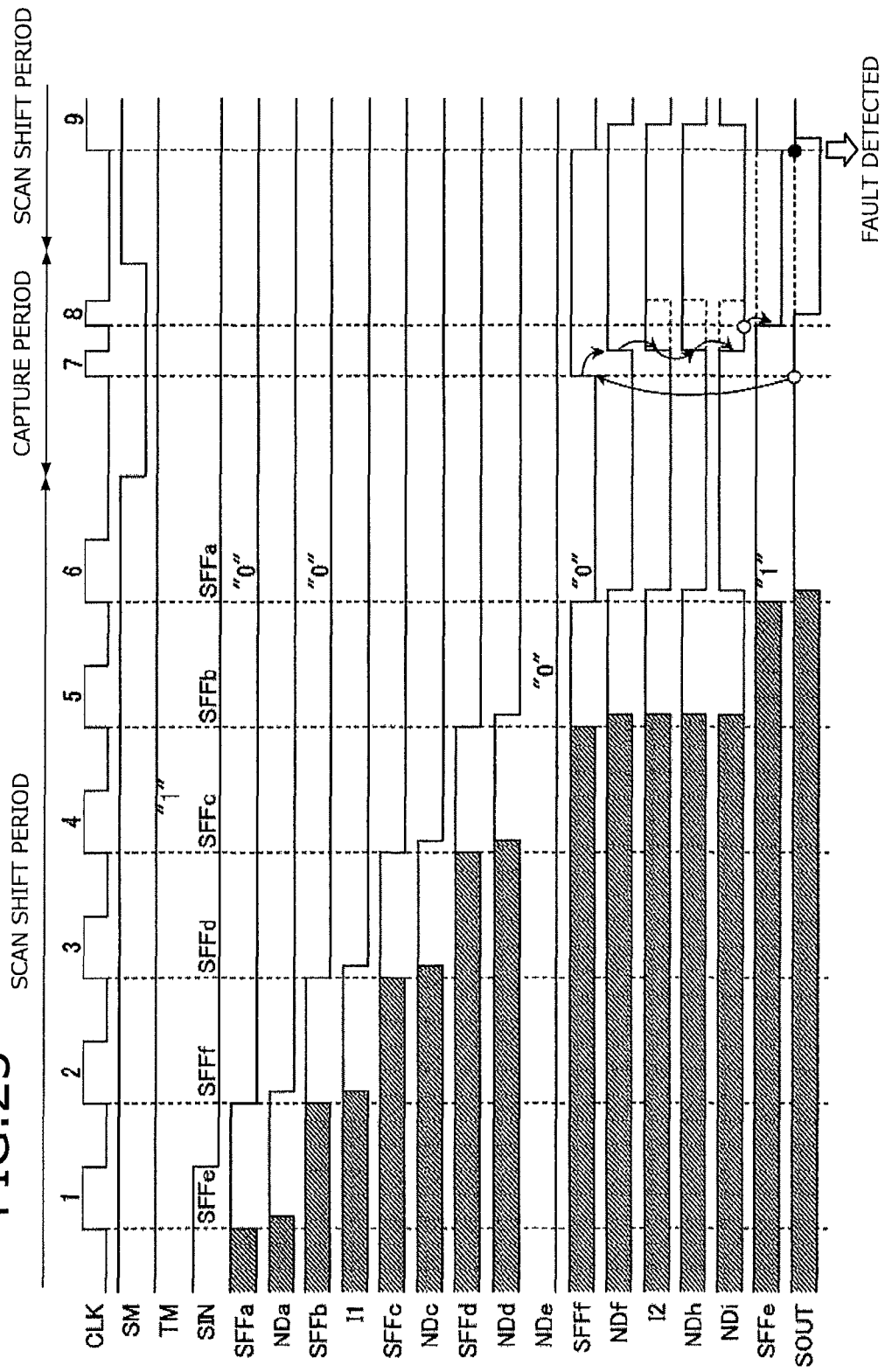
FIG. 25 is an explanatory diagram of an example of the test to detect a delay fault F4.

FIG. 25 is an explanatory diagram of an example of the test to detect a delay fault F4. The operation depicted in FIG. 25 is implemented by an execution of the fault detecting program by the tester. In this example, at the first to the sixth clock cycles, 1, 0, 0, 0, 0, and 0 are supplied in sequence to the scan input SIN. At the sixth clock cycle, the flip-flops SFFb, SFFa, SFFf, and SFFe are set to 0, 0, 0, and 1, respectively. Namely, at the sixth clock cycle, the flip-flops SFFb and SFFa connected in series to the input terminal I1 of the OR circuit OR1 hold values identical to one another. The flip-flops SFFf and SFFe connected in series to the input terminal I2 of the OR circuit OR1 by way of the AND circuit AND2 and the OR circuit OR2 hold values opposite to one another.

Thus, at the seventh clock cycle of the capture period, the value held by the flip-flop SFFf can be changed from 0 to 1, using the value held by the flip-flop SFFe one clock cycle before. Namely, at the seventh clock cycle, with the input terminal I1 of the OR circuit OR1 maintained at 0, the input terminal I2 of the OR circuit OR1 can be changed from 0 to 1.

When there is no delay fault F4, the change of the value held by the flip-flop SFFf is immediately transmitted to the input terminal I2 of the OR circuit OR1 and the nodes NDh and NDi. The flip-flop SFFe latches 0 at the eighth clock cycle and the tester, by reading in 0 as the value of the signal from the scan out terminal SOUT at the ninth clock cycle, detects the absence of the delay fault F4.

On the other hand, the delay fault F4 has occurred, the change of the value held by the flip-flop SFFf is transmitted belatedly to the input terminal I2 of the OR circuit OR1, the output node NDh of the OR circuit OR1, or the output node NDi of the circuit CC2.

When the flip-flop SFFe cannot latch 0 of the node NDi at the eighth clock cycle, the value of the signal from the scan out terminal SOUT is maintained at 1. The tester, by reading in 1 as the value of the signal from the scan out terminal SOUT at the ninth clock cycle of the scan shift period, detects the presence of the delay fault F4.

As described, the circuit design support apparatus 100 connects the output terminal of the second flip-flop for scanning downstream from the signal line, to the data input terminal of the first flip-flop for scanning of the control circuit connected to the signal line to be controlled. This makes it possible to control the value of the signal line by the value of the second flip-flop, which has little effect on other signal lines, etc., and improve the delay fault detection accuracy.

The circuit design support apparatus 100 selects one second flip-flop among the second flip-flops whose number of logic steps from the signal line to be controlled is within the predetermined number of steps, among the second flip-flops at the output destination of the logic circuit having the input terminal to which the signal line that is to be controlled is connected. Although layout design has not yet been performed at the time of inserting the control circuit CL, if the first flip-flop for scanning of the control circuit to be connected to the signal line to be controlled and the second flip-flop having a large number of logic steps are connected, then it is possible that these two flip-flops are arranged distantly or that the layout cannot be performed. For this reason, with the selection of the second flip-flop whose number of logic steps from the signal line to be controlled is within the predetermined number of steps, the second flip-flop, which is highly likely to be arranged closer to the signal line to be controlled, is connected and the layout can be made easier.

The circuit design support apparatus 100 selects the second flip-flop having the least number of logic steps from the signal line to be controlled, among the second flip-flops at the output destination. Consequently, the flip-flop highly likely to be arranged closer to the control candidate is connected and the layout can be made easier.

The circuit design support apparatus 100 selects the second flip-flop having the least number of logic steps among the second flip-flops and third flip-flops that are for scanning and that are to be used for the observation. This makes it possible to connect the output terminal of the flip-flop highly likely to be arranged closer to the control candidate to the data input terminal of the first flip-flop within the control circuit.

The circuit design support apparatus 100 selects the flip-flop having the least number of logic steps among the second flip-flops and the third flip-flops that are for scanning and that are to be used for the observation. This makes it possible to connect the output terminal of the flip-flop highly likely to be arranged closer to the control candidate to the data input terminal of the first flip-flop within the control circuit.

The circuit design support apparatus 100 selects the flip-flop having the least number of logic steps, among the third flip-flops whose number of logic steps is within the predetermined number of steps among the third flip-flops, and the second flip-flops whose number of logic steps is within the predetermined number of steps among the second flip-flops. This makes it possible to connect the output terminal of the flip-flop highly likely to be arranged closer to the control candidate to the data input terminal of the first flip-flop within the control circuit.

The circuit design support method described in this embodiment can be implemented by an execution of a preliminarily prepared program on a computer such as a personal computer and a workstation. This circuit design support program is recorded on a recording medium that can be read by the computer, such as the disk 405, a universal serial bus (USB), and flash memory, and is executed by being read out from the recording medium by the computer. The circuit design support program may be distributed by way of the network NET such as the Internet.

According to one aspect of an embodiment, fault detection accuracy can be improved.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A circuit design support method, comprising:
   obtaining given circuit information that indicates a given circuit that has a logic circuit in which a plurality of signal lines are connected to input terminals of the logic circuit, wherein signals of the signal lines are output via the logic circuit;
   obtaining control circuit information concerning a control circuit that has a first flip-flop for scanning and that is capable of controlling a value of a given signal line among the signal lines that is to be controlled by a value set by the first flip-flop;
   selecting by a computer and based on the obtained given circuit information, a second flip-flop among second flip-flops of the given circuit at an output destination of a signal of a given signal line from the logic circuit; and
   generating by the computer and based on the obtained control circuit information, connection information that indicates a connection of the control circuit in series between an output source of the signal of the given signal line and the given signal line and a connection of a data input terminal of the first flip-flop and an output terminal of the selected second flip-flop.

2. The circuit design support method according to claim 1, wherein
the selecting a second flip-flop includes selecting the second flip-flop among the second flip-flops at the output destination whose number of logic steps from the given signal line is within a predetermined number of steps.

3. The circuit design support method according to claim 1, wherein
the selecting a second flip-flop includes selecting, among the second flip flops at the output destination, the second flip-flop having a least number of logic steps from the given signal line.

4. The circuit design support method according to claim 1, wherein
the generating connection information includes generating the connection information that indicates a fixing of a value to be input to the data input terminal of the first flip-flop, when there is no second flip-flop at the output destination, the value being fixed at a value that is based on a non-controlled value of the logic circuit.

5. The circuit design support method according to claim 1, wherein
the selecting a second flip-flop includes selecting, among a plurality of flip flops, a flip-flop having, from the given signal line, a number of logic steps that is least among the second flip-flops at the output destination, and selecting third flip-flops that are for scanning and that are capable of observing a value of a signal line that is to be observed, and are connected to the signal line to be observed within the given circuit.

6. The circuit design support method according to claim 5, wherein
the selecting a second flip-flop includes selecting a flip-flop among the flip-flops whose number of logic steps is within a predetermined number of steps, among the second flip-flops at the output destination and the third flip-flops.

7. The circuit design support method according to claim 6, wherein
the generating connection information includes generating the connection information that indicates a fixing of a value to be input to the data input terminal of the first flip-flop, when no flip-flop within the predetermined number of steps is present among the second flip-flops at the output destination and the third flip-flops, the value being fixed at a value that is based on a non-controlled value of the logic circuit.

8. A non-transitory, computer-readable recording medium stores a circuit design support program that causes a computer to execute a process comprising:

obtaining given circuit information that indicates a given circuit that has a logic circuit in which a plurality of signal lines are connected to input terminals of the logic circuit, wherein signals of the signal lines are output via the logic circuit;

obtaining control circuit information concerning a control circuit that has a first flip-flop for scanning and that is capable of controlling a value of a given signal line among the signal lines that is to be controlled by a value set by the first flip-flop;

selecting, based on the obtained given circuit information, a second flip-flop among second flip-flops of the given circuit at an output destination of a signal from the logic circuit; and generating, based on the obtained control circuit information, a connection information that indicates connection of the control circuit in series between an output source of the signal of the given signal line and the given signal line and a connection of a data input terminal of the first flip-flop and an output terminal of the selected second flip-flop.

9. A circuit design support apparatus comprising:

a processor configured to:

obtain given circuit information that indicates a given circuit that has a logic circuit in which a plurality of signal lines are connected to input terminals of the logic circuit, wherein signals of the signal lines are output via the logic circuit;

obtain control circuit information concerning a control circuit that has a first flip-flop for scanning and that is capable of controlling a value of a given signal line among the signal lines that is to be controlled by a value set by the first flip-flop;

select, based on the obtained given circuit information, a second flip-flop among second flip-flops of the given circuit at an output destination of a signal from the logic circuit; and generate, based on the obtained control circuit information, connection information that indicates a connection of the control circuit in series between an output source of the signal of the given signal line and the given signal line and a connection of a data input terminal of the first flip-flop and an output terminal of the selected second flip-flop.

* * * * *